United States Patent
Tanaka

(10) Patent No.: US 7,951,654 B2
(45) Date of Patent: May 31, 2011

(54) METHOD OF FABRICATING SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/704,617

(22) Filed: Feb. 12, 2010

(65) Prior Publication Data

US 2010/0184277 A1    Jul. 22, 2010

Related U.S. Application Data

(63) Continuation of application No. 09/842,797, filed on Apr. 27, 2001, now Pat. No. 7,662,677.

(30) Foreign Application Priority Data

Apr. 28, 2000 (JP) ................................. 2000-130782

(51) Int. Cl.
*H01L 21/00* (2006.01)
*H01L 21/20* (2006.01)

(52) U.S. Cl. .. 438/150; 438/166; 438/486; 257/E21.134

(58) Field of Classification Search .................. 438/150, 438/166, 486, 487; 257/E21.134
See application file for complete search history.

(56) References Cited

U.S. PATENT DOCUMENTS

| | | | |
|---|---|---|---|
| 4,439,245 A | 3/1984 | Wu | |
| 5,247,190 A | 9/1993 | Friend et al. | |
| 5,365,080 A | 11/1994 | Yamazaki et al. | |
| 5,365,875 A | 11/1994 | Asai et al. | |
| 5,399,502 A | 3/1995 | Friend et al. | |
| 5,413,958 A | 5/1995 | Imahashi et al. | |
| 5,561,081 A | 10/1996 | Takenouchi et al. | |
| 5,591,668 A | 1/1997 | Maegawa et al. | |
| 5,643,801 A | 7/1997 | Ishihara et al. | |
| 5,643,826 A | 7/1997 | Ohtani et al. | |

(Continued)

FOREIGN PATENT DOCUMENTS

EP          820132 A3          4/1998

(Continued)

OTHER PUBLICATIONS

Andra, G., et al., "Laser Induced Crystallization: A Mehod for Preparing Silicon Thin Film Solar Cells", Conference Record of The 26th IEEE PVSC (Photovoltaic Specialists Conference), 1997, pp. 639-642.

(Continued)

*Primary Examiner* — Michael Trinh
(74) *Attorney, Agent, or Firm* — Fish & Richardson P.C.

(57) ABSTRACT

A semiconductor device is fabricated by forming a first crystalline region by irradiating a laser beam to a first region of an amorphous semiconductor film by relatively moving the laser beam with respect to the first region of the amorphous semiconductor film. A second crystalline region is formed by irradiating the laser beam to a second region of the amorphous semiconductor film including a portion of the first crystalline region by relatively moving the laser beam with respect to the second region of the amorphous semiconductor film. The wavelength of the laser beam falls in a range of 370 rim through 650 nm. In general, crystalline performance of the first crystalline region, the second crystalline region, and a region of overlap between the first crystalline region and the second crystalline region are the same.

18 Claims, 27 Drawing Sheets

U.S. PATENT DOCUMENTS

| | | |
|---|---|---|
| 5,648,277 A | 7/1997 | Zhang et al. |
| 5,891,764 A | 4/1999 | Ishihara et al. |
| 5,893,730 A | 4/1999 | Yamazaki et al. |
| 5,893,990 A | 4/1999 | Tanaka |
| 5,923,962 A | 7/1999 | Ohtani et al. |
| 5,953,597 A | 9/1999 | Kusumoto et al. |
| 6,020,224 A | 2/2000 | Shimogaichi et al. |
| 6,156,997 A | 12/2000 | Yamazaki et al. |
| 6,204,099 B1 | 3/2001 | Kusumoto et al. |
| 6,285,042 B1 | 9/2001 | Ohtani et al. |
| 6,335,541 B1 | 1/2002 | Ohtani et al. |
| 6,534,744 B1 | 3/2003 | Yamazaki et al. |
| 6,563,843 B1 | 5/2003 | Tanaka |
| 6,693,257 B1 | 2/2004 | Tanaka |
| 6,730,550 B1 | 5/2004 | Yamazaki et al. |
| 6,753,212 B2 | 6/2004 | Yamazaki et al. |
| 6,856,630 B2 | 2/2005 | Tanaka |
| 6,872,607 B2 | 3/2005 | Tanaka |
| 6,916,693 B2 | 7/2005 | Ohnuma et al. |
| 6,974,731 B2 | 12/2005 | Yamazaki et al. |
| 6,998,639 B2 | 2/2006 | Ohtani et al. |
| 7,098,084 B2 | 8/2006 | Tanaka et al. |
| 7,112,477 B2 | 9/2006 | Tanaka |
| 7,135,390 B2 | 11/2006 | Tanaka |
| 7,179,698 B2 | 2/2007 | Yamazaki et al. |
| 7,183,145 B2 | 2/2007 | Tanaka et al. |
| 7,229,864 B2 | 6/2007 | Tanaka |
| 7,336,685 B2 | 2/2008 | Tanaka |
| 7,375,010 B2 | 5/2008 | Tanaka |
| 7,384,832 B2 | 6/2008 | Tanaka |
| 7,473,622 B2 | 1/2009 | Yamazaki et al. |
| 7,662,677 B2 * | 2/2010 | Tanaka .......................... 438/150 |
| 2007/0004110 A1 | 1/2007 | Tanaka |
| 2007/0184593 A1 | 8/2007 | Tanaka et al. |
| 2009/0035923 A1 | 2/2009 | Ohtani et al. |

FOREIGN PATENT DOCUMENTS

| | | |
|---|---|---|
| JP | 10092576 A | 4/1998 |
| JP | 10163547 A | 6/1998 |
| WO | WO9013148 A1 | 11/1990 |

OTHER PUBLICATIONS

Hayashi, H., et al., "Fabrication of Low-Temperature Bottom-Gate Poly-Si TFTs on Large-Area Substrate by Linear-Beam Excimer Laser Crystallization and Ion Doping Method", IEDM 95: Technical Digest of International Electron Devices Meeting, 1995, pp. 33.3.1-33.3.4 (829-832).

Schenk, H., et al., "Polymers for Light Emitting Diodes", EuroDisplay '99 : The 19th International Display Research Conference, Sep. 6, 1999, pp. 33-37.

* cited by examiner

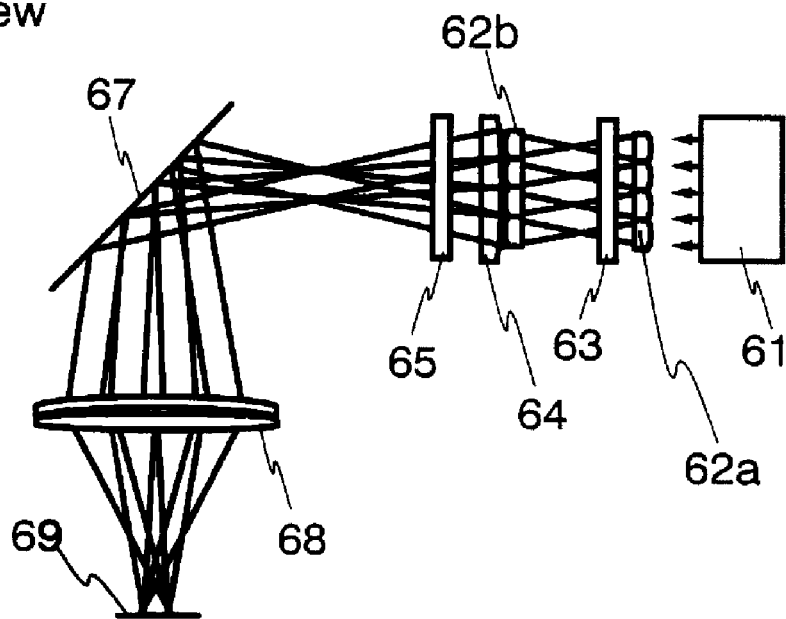
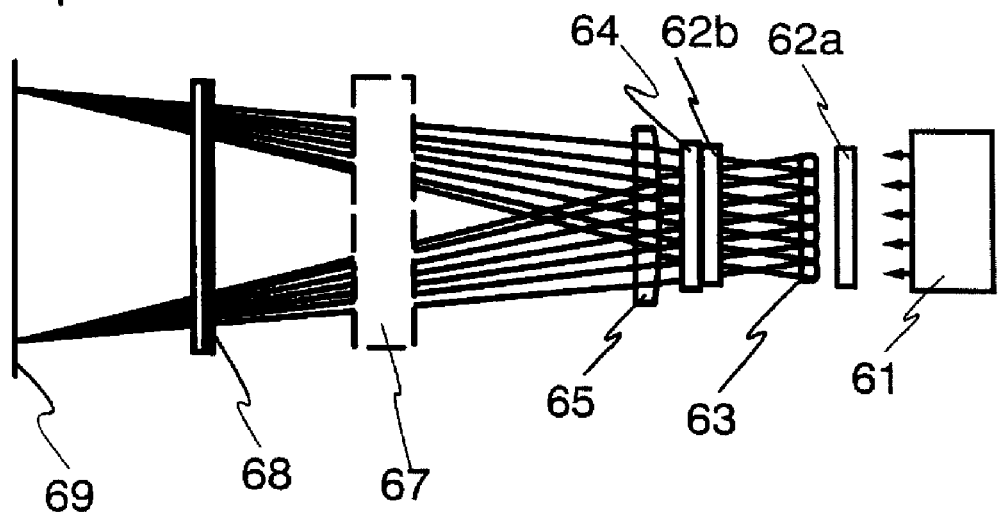
Fig. 1 Prior Art

Lateral view
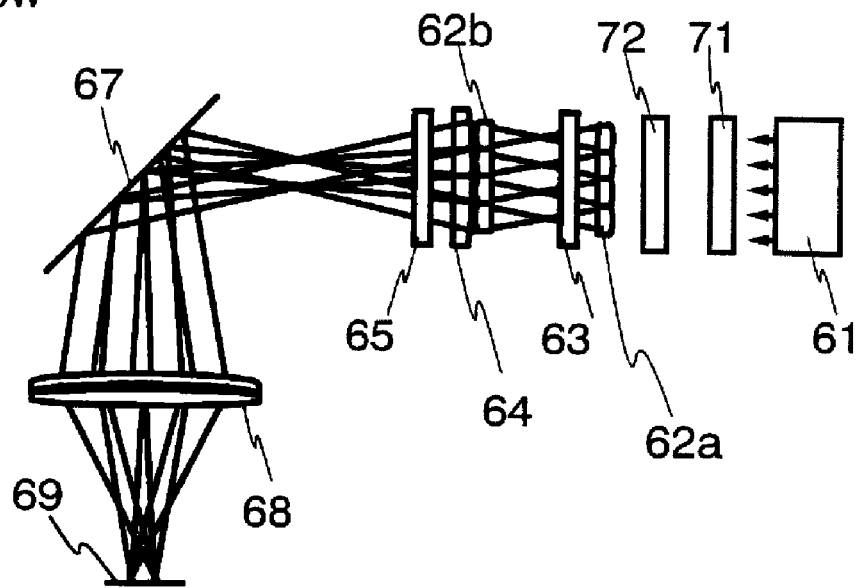
Top view
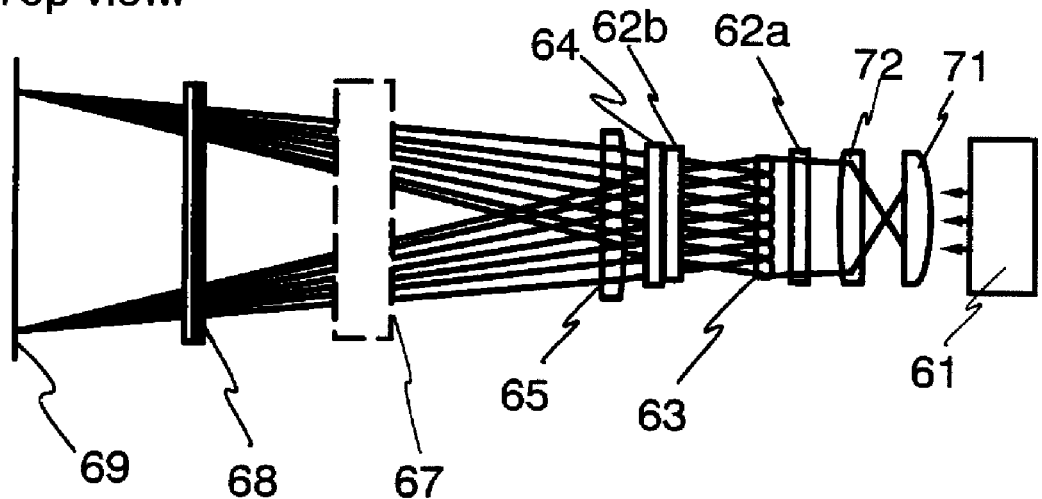
Fig. 5

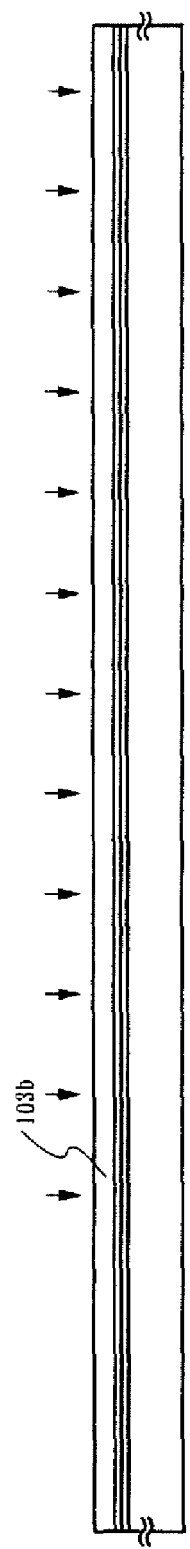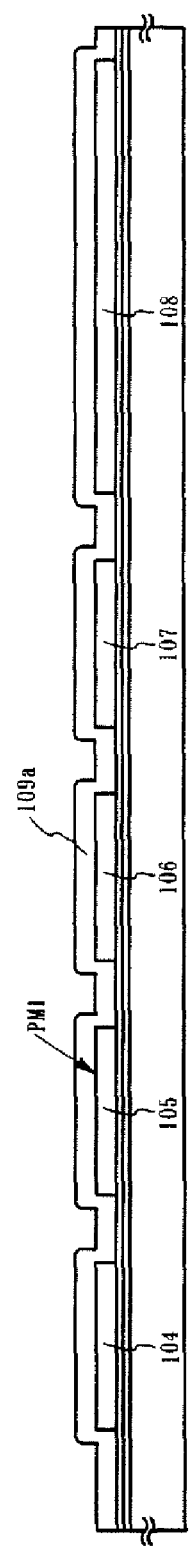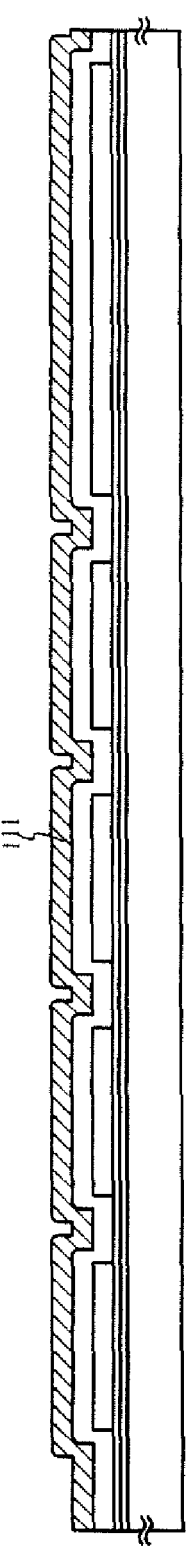

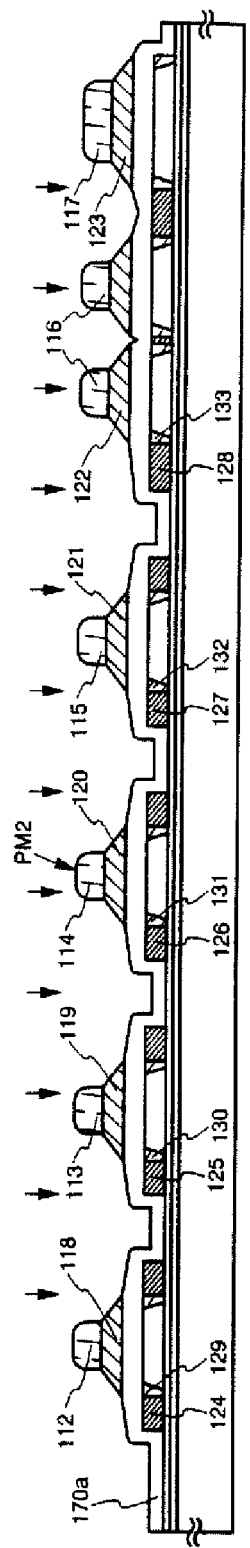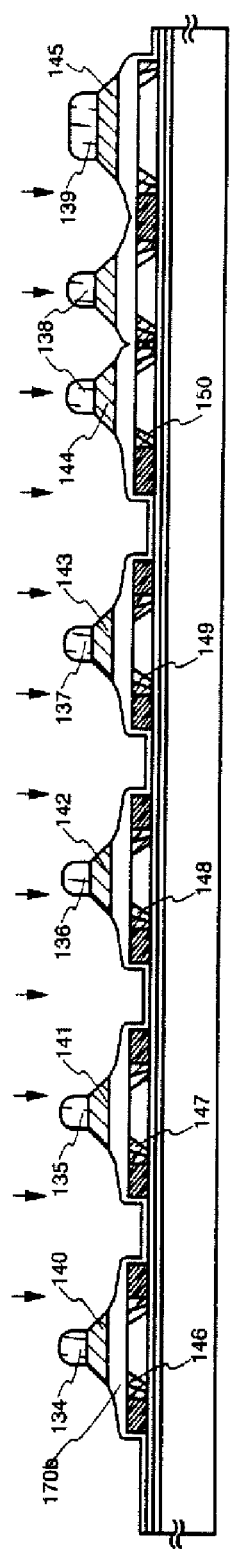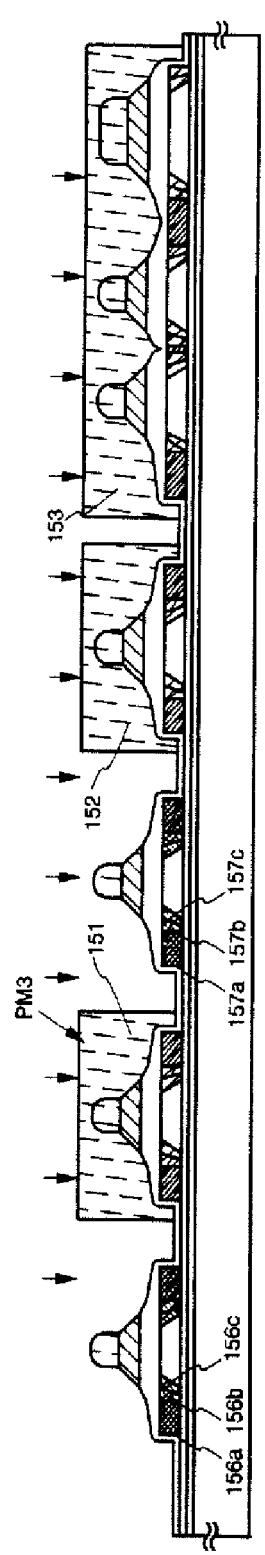

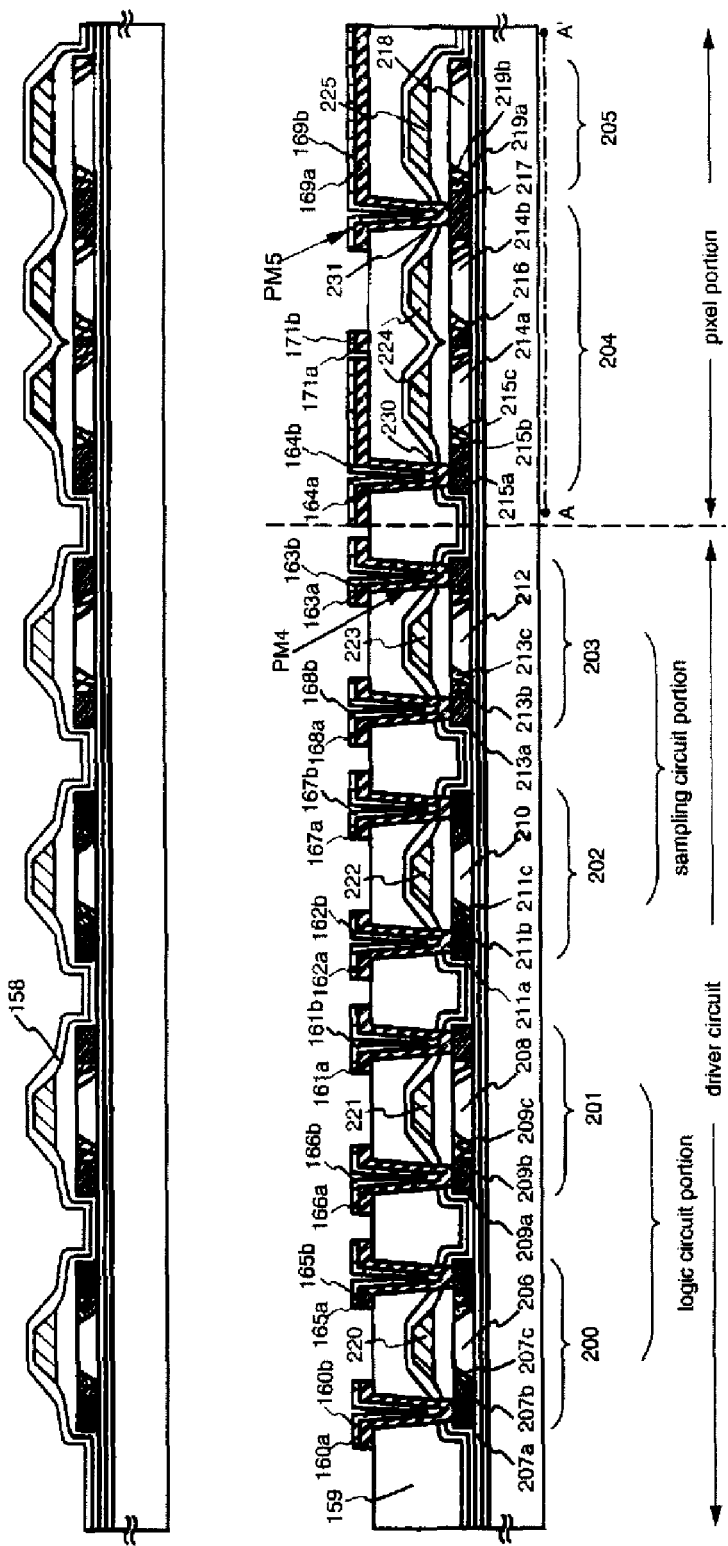

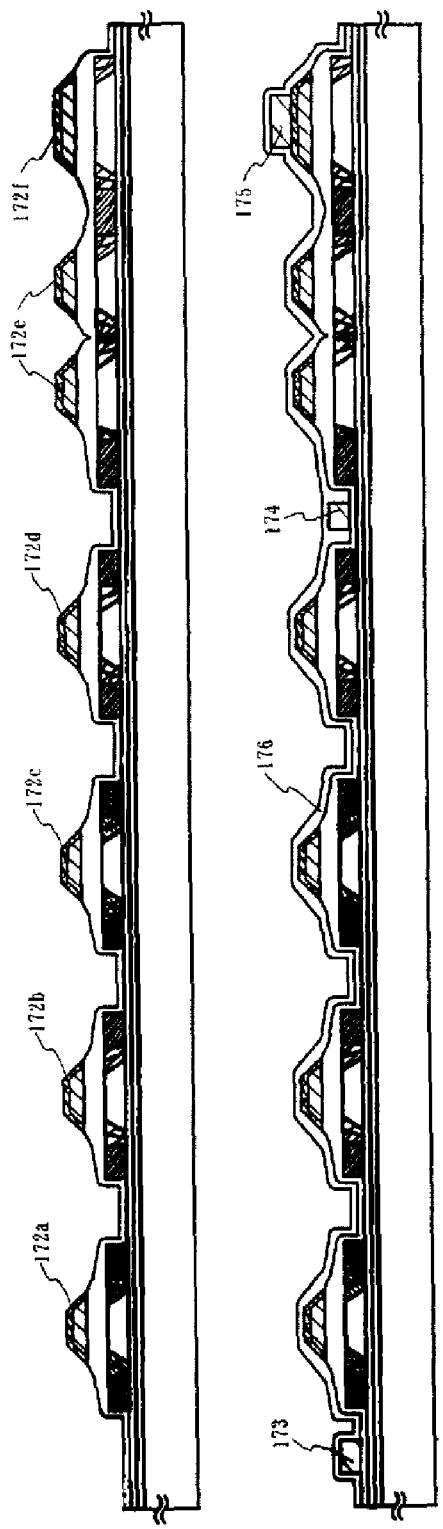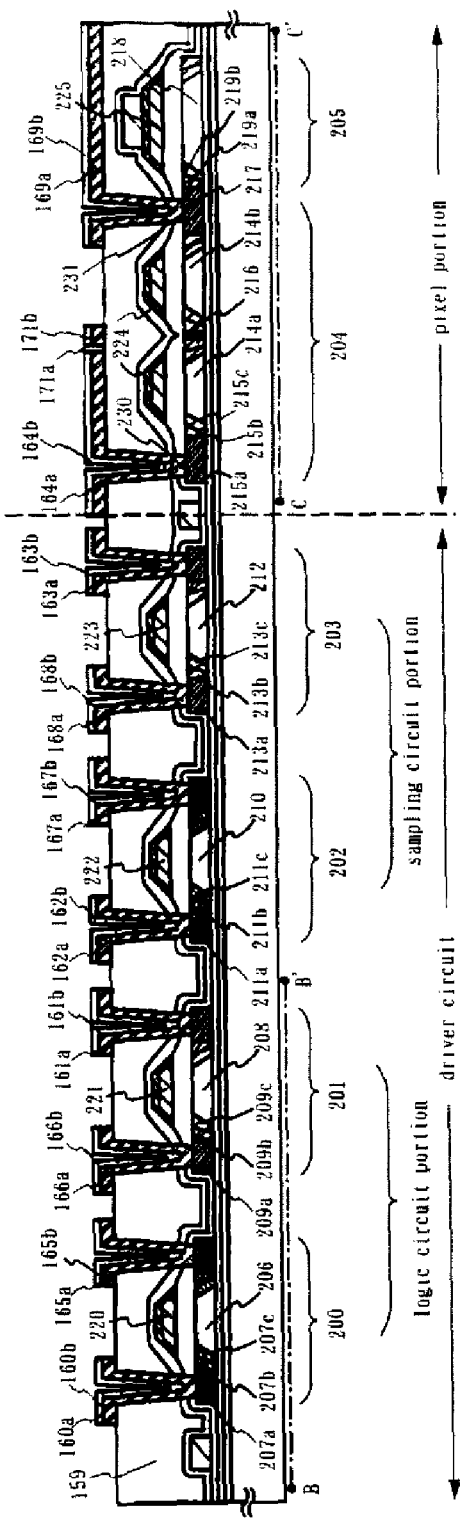
Fig. 10A
Fig. 10B
Fig. 10C logic circuit sampling circuit

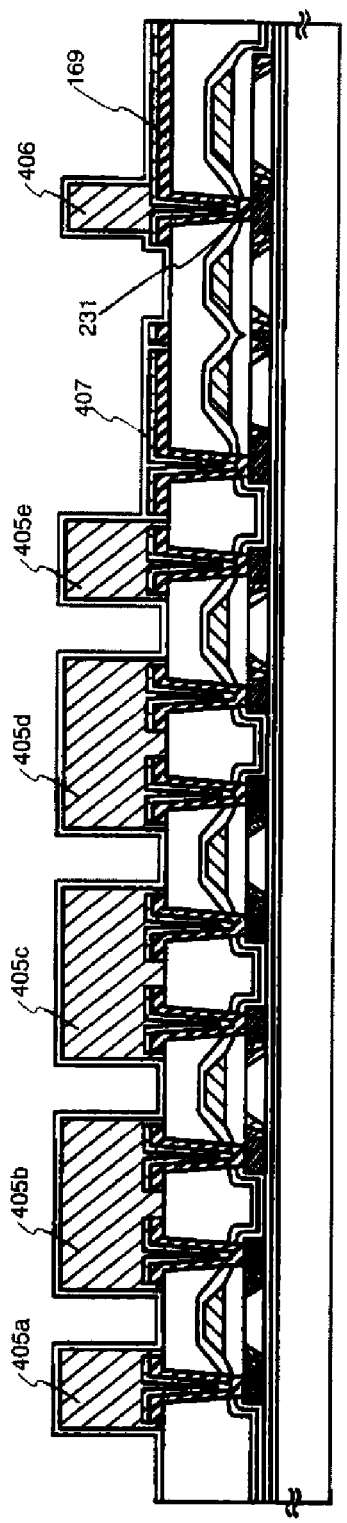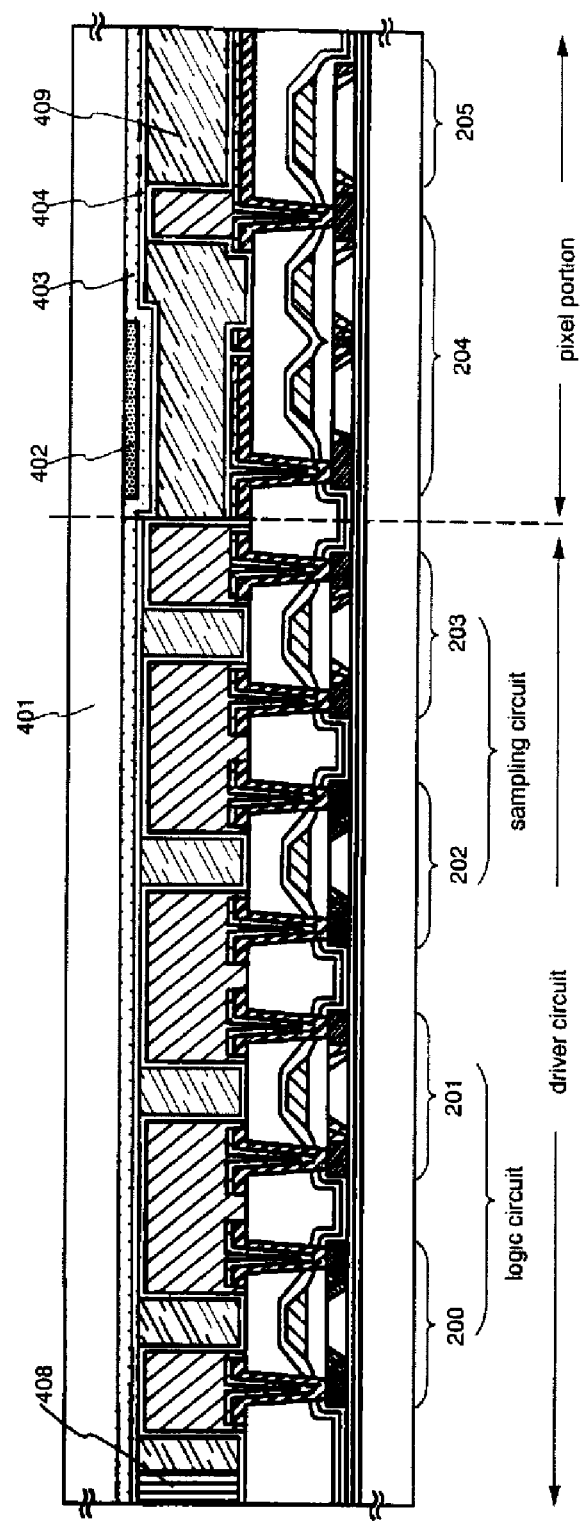
Fig. 16A
Fig. 16B

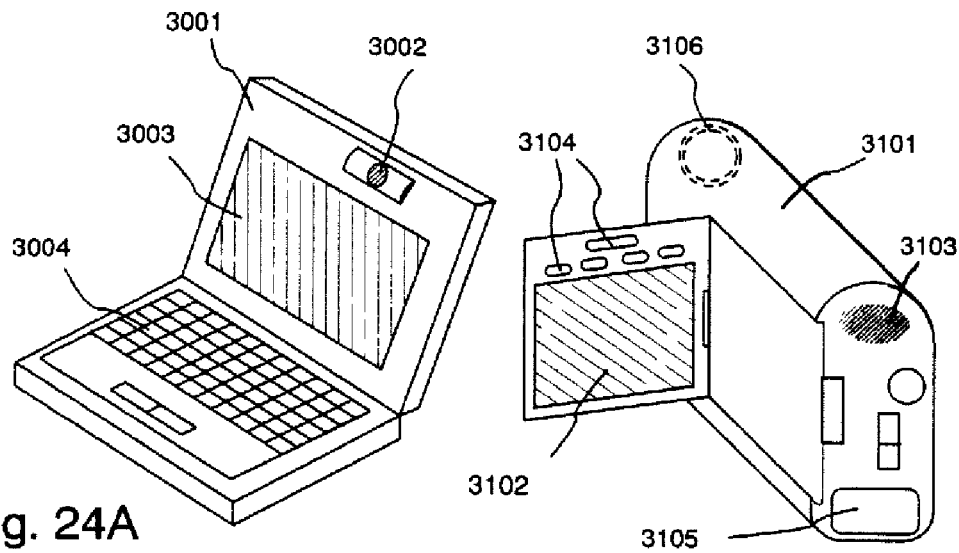
Fig. 24A
Fig. 24B
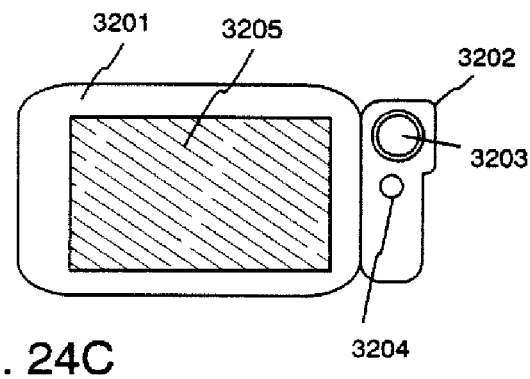
Fig. 24C
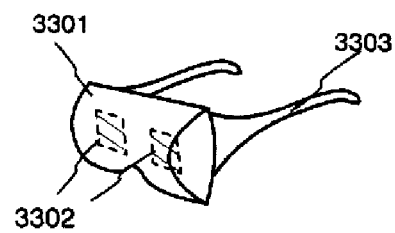
Fig. 24D
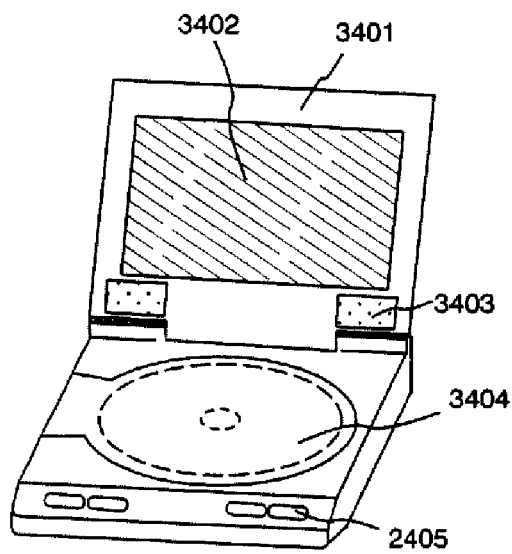
Fig. 24E
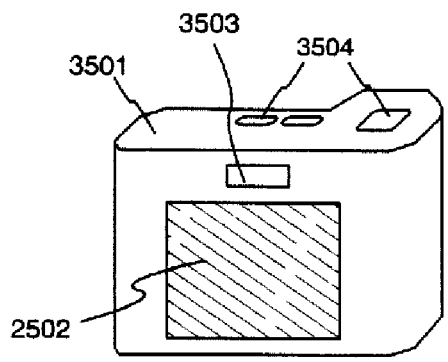
Fig. 24F

METHOD OF FABRICATING SEMICONDUCTOR DEVICE

CROSS-REFERENCE TO RELATED APPLICATIONS

This application is a continuation of U.S. application Ser. No. 09/842,797, filed Apr. 27, 2001, issued on Feb. 16, 2010 as U.S. Pat. No. 7,662,677, which claims the benefit of a foreign priority application filed in Japan as Serial No. 2000-130782 on Apr. 28, 2000, both of which are incorporated by reference

BACKGROUND OF THE INVENTION

1. Field of the Invention

The present invention relates to a method of fabricating a semiconductor device having a circuit constituted by a thin film transistor (hereinafter, referred to as TFT). For example, the invention relates to an electro-optic apparatus represented by a liquid crystal display apparatus and a constitution of an electric apparatus mounted with an electro-optic apparatus as a part thereof. Further, in the specification, a semiconductor device generally indicates an apparatus capable of functioning by utilizing semiconductor properties and an electro-optic apparatus and an electric apparatus, mentioned above, pertain to the category.

2. Description of the Related Art

In recent years, there have been widely carried out researches on a technology in which an amorphous semiconductor film formed above an insulating substrate of glass or the like is subjected to laser annealing to thereby crystallize the amorphous semiconductor and promoting crystalline performance thereof. Silicon is frequently used for the amorphous semiconductor film.

In comparison with a quartz substrate which has frequently be used conventionally, a glass substrate is provided with advantages that the glass substrate is inexpensive and rich in workability and the glass substrate having a large area can easily be fabricated. This is the reason that the above-described researches are carried out. Further, laser is preferably used in crystallizing the amorphous semiconductor since the melting point of the glass substrate is low. Laser can provide high energy only to an amorphous semiconductor film without considerably rising temperature of a substrate.

Since a crystalline semiconductor is constituted by a number of crystal grains, a film thereof is referred also as a polycrystal semiconductor film. A crystalline semiconductor film formed by being subjected to laser annealing is provided with high mobility and therefore, a thin film transistor (TFT) is formed by using the crystalline semiconductor film and the crystalline semiconductor film is intensively utilized in, for example, a liquid crystal electro-optic apparatus of a monolithic type in which TFTs for driving a pixel and for a drive circuit are fabricated above one sheet of a glass substrate.

Further, there is preferably used a method of carrying out laser annealing by shaping pulse laser beam such as excimer laser to constitute a square spot of several centimeters square or a linear shape having a length equal to or larger than 10 cm at an irradiated face or a vicinity thereof and scanning the laser beam (or moving an irradiated position of laser beam relatively to an irradiated face) since the method is provided with high productivity and is excellent industrially.

Particularly, when linear beam is used, the productivity is high since different from a case of using laser beam in a shape of a spot where scanning in front and rear direction and left and right direction is needed, laser can be irradiated to a total of an irradiated face by scanning the linear beam only in a direction orthogonal to a longitudinal direction thereof. Laser is scanned in the direction orthogonal to the longitudinal direction since the direction is the most efficient scanning direction. Owing to the high productivity, currently, the main stream is being established by using linear beam produced by shaping pulse oscillated excimer laser beam by a pertinent optical system.

FIG. 1 shows an example of a constitution of an optical system for shaping the shape of laser beam in a linear shape at an irradiated face or in the vicinity thereof. The constitution is extremely general and the constitution of FIG. 1 is applied to all of the optical systems. The constitution not only converts the shape of laser beam into a linear shape but, simultaneously, homogenizes energy of the laser beam at an irradiated face. Generally, an optical system for homogenizing energy of beam is referred to as a beam homogenizer.

When excimer laser as an ultraviolet ray is used for a light source, all of the mother material of the optical system is preferably constituted by quartz. This is because high transmittance is achieved. Further, there is preferably used a coating having 99% or more of transmittance with respect to a wavelength of excimer laser used.

First, an explanation will be given of a side view of FIG. 1. Laser beam emitted from a laser oscillator 61 is split in a direction orthogonal to a direction of progress of the laser beam by cylindrical array lenses 62a and 62b. In the specification, the above-described direction is referred to as vertical direction. When a mirror is put to a middle of an optical system, the vertical direction is bent in a direction of light bent by the mirror. According to the constitution, four splits are constituted. The splits of the laser beam are temporarily summarized into a single piece of laser beam by a cylindrical array lens 64. The laser beam is reflected by a mirror 67 and thereafter focused again into a single piece of laser beam at an irradiated face 69 by a doublet cylindrical lens 68. A doublet cylindrical lens designates a lens constituted by two sheets of cylindrical lenses. Thereby, there are determined homogenizing of energy of linear beam in the width direction and a length thereof in the width direction.

Next, an explanation will be given of a top view of FIG. 1. Laser beam emitted from the laser oscillator 61 is split in a direction orthogonal to the direction of progress of the laser beam and a direction orthogonal to the vertical direction by a cylindrical array lens 63. In the specification, the direction is referred to as horizontal direction. When a mirror is put to a middle of an optical system, the horizontal direction is bent in a direction of light bent by the mirror. According to the constitution, seven splits are constituted. Thereafter, the laser beam is synthesized into a single piece thereof by the cylindrical lens 64. Thereby, there are determined homogenizing of energy in the longitudinal direction of the linear beam and a length thereof.

The above-described lenses are made of synthesized quartz to correspond to excimer laser. Further, surfaces thereof are provided with coatings to transmit excimer laser excellently. Thereby, transmittance of excimer laser per lens becomes equal to or larger than 99%.

By irradiating the linear beam shaped by the above-described constitution in an overlapping manner while gradually shifting the laser beam in the width direction, an amorphous semiconductor can be crystallized or crystalline performance thereof can be promoted by subjecting an entire face of the amorphous semiconductor to laser annealing.

Next, a description will be given of a typical method of fabricating a semiconductor film constituting an object of irradiation. First, as a substrate, there is prepared a Corning 1737 substrate of 5-inch square having a thickness of 0.7 mm. An SiO$_2$ film (silicon oxide film) having a thickness of 200 nm is formed above the substrate by using a plasma CVD apparatus and an amorphous silicon film (hereafter, expressed as a—Si film) having a thickness of 50 nm on the surface of the SiO$_2$ film. The substrate is exposed to an atmosphere of nitrogen gas at temperature of 500 degree for 1 hour to thereby reduce a hydrogen concentration in the film. Thereby, laser resistance of the film is remarkably promoted.

As a laser apparatus, there is used XeCl excimer laser (wavelength 308 nm, pulse width 30 ns) L3308 made by Lamda Co. Ltd. The laser apparatus is provided with a function of emitting pulse-oscillated laser and outputting energy of 500 mJ/pulse. The size of the laser beam is 10 mm×30 mm (both are half value widths at a beam profile) at an outlet of the laser beam. In the specification, the outlet of laser beam is a plane orthogonal to the direction of progress of the laser beam immediately after emitting the laser beam from a laser irradiating apparatus.

A shape of laser beam emitted by excimer laser is generally rectangular and falls in a range of about 3 through 5 when expressed by an aspect ratio. The intensity of laser beam shows a Gaussian distribution such that the more proximate to the center of the laser beam, the stronger the distribution. The size of the laser beam is converted into linear beam of 125 mm×0.4 mm having a uniform energy distribution by an optical system having the constitution shown by FIG. 1.

FIGS. 2A, 2B, 2C and 2D show a behavior of a state of irradiating linear beam by 2 pulses viewed from an upper face thereof and according to FIGS. 2A through 2D, a pitch of overlapping the beam width (half value width in beam profile) of the linear beam is changed. When laser is irradiated to the above-described semiconductor film, it is found that the pitch of overlapping the beam width is most pertinent to be around $\frac{1}{10}$ of the beam width of the linear beam as shown by FIG. 2A. Thereby, the uniformity of crystal quality in the film of the semiconductor film is promoted. According to the above-described example, the half value width is 0.4 mm and accordingly, laser beam is irradiated by setting a pulse frequency of excimer laser to 30 Hz and scanning speed to 1.0 mm/s. At this occasion, an energy density at the irradiated face of laser beam is set to 420 mJ/cm$^2$. The above-described method is an extremely general method used for crystallizing a semiconductor film by using linear beam.

In carrying out laser annealing, laser beam is shaped into a linear beam having a linear shape at an irradiated face or in the vicinity thereof by using an optical system as shown by FIG. 1. As shown by FIG. 2A, the pitch of overlapping of the linear beam in the beam width is set to around $\frac{1}{10}$ of the beam width.

Further, as shown by FIG. 3, the wavelength of excimer laser is 308 nm and accordingly, the absorption coefficient at the wavelength is $1.38 \times 10^6$ cm$^{-1}$ for an amorphous silicon film and $1.56 \times 10^6$ cm$^{-1}$ for a polycrystal silicon film and accordingly, the absorption coefficients of the amorphous silicon film and the polycrystal silicon film are substantially the same.

From the above-described, when laser annealing is carried out by excimer laser, recrystallization is carried out by a number of times with respect to a region which has been crystallized once. Therefore, a dispersion in a grain size is caused.

Further, in the current state, the longitudinal length of the linear beam is about 100 mm. Even when the longitudinal length of the linear beam is expanded by using a beam expander, a limit of the length is about 150 mm in consideration of uniformity and energy density of the linear beam.

Meanwhile, large area formation of a substrate used has been progressed and as a large area substrate, there has been used, for example, a substrate of 600 mm×720 mm, a substrate of 320 mm×400 mm or a substrate of 8 inches (diameter: about 200 mm) in a circular shape. FIG. 4 shows an example of a method of irradiating the linear beam to such a large area substrate.

FIGS. 4A, 4B and 4C and FIGS. 27A, 27B and 27C show an example of irradiating the linear beam having the longitudinal length of 150 mm to a substrate of 320 mm×400 mm formed with an amorphous semiconductor film by scanning the linear beam (or moving a position of irradiating the linear beam relative to an irradiated face). According to a method of irradiating the linear beam as shown by FIGS. 4A, 4B and 4C and FIGS. 27A, 27B and 27C, regions of scanning the linear beam overlap at a central portion of the substrate (FIG. 4A, FIG. 27A) or the central portion of the substrate is not irradiated (FIG. 4B, FIG. 27B). Further, there is pointed out a method of irradiating the linear beam such that ends of irradiation by the linear beam are brought into contact with each other at the central portion of the substrate as shown by FIG. 4C and FIG. 27C.

When the linear beam is irradiated as shown by FIG. 4A and FIG. 27A, as has already been described, the absorption coefficients of excimer laser with regard to an amorphous silicon film and a polycrystal silicon film are almost the same and accordingly, at the central portion of the substrate which is an overlapped portion of the regions of scanning the linear beam, recrystallization is carried out by a number of times and a dispersion in grain size is caused. Therefore, even when TFT is fabricated by using the central portion of the substrate and electric properties thereof are measured, excellent properties are not achieved.

When the linear beam is irradiated as shown by FIG. 4B and FIG. 27B, laser annealing is not carried out at the central portion of the substrate and accordingly, the amorphous silicon film is not crystallized and crystalline performance of the amorphous silicon film differs from that of the crystalline silicon film provided by being subjected to laser annealing. Even when TFT is fabricated by using such a silicon film and electric properties are measured, the properties at the central portion of the substrate are significantly deteriorated.

When the linear beam is irradiated as shown by FIG. 4C and FIG. 27C, the energy density at both ends of the linear beam in the longitudinal direction is considerably lower than that at a vicinity of the center of the linear beam and therefore, the crystalline performance is deteriorated at the central portion of the substrate where ends of irradiation of the linear beam are present. Even when TFT is fabricated by using such a silicon film and electric properties are measure, a dispersion in the electric properties is caused in the substrate.

That is, as shown by FIGS. 4A through 4C and FIGS. 27A through 27C, when laser annealing is carried out by scanning the linear beam to a large area substrate, in any of the cases, there is produced a region having poor crystalline performance and even when TFT is fabricated with the region as an activation layer, excellent properties cannot be achieved in electric properties of the TFT.

SUMMARY OF THE INVENTION

It is an object of the invention to provide a crystalline semiconductor film having excellent crystalline performance by forming a first crystalline region provided by being subjected to laser annealing by using laser beam having a wavelength in a range of 370 nm through 650 nm and irradiating the laser beam to an amorphous semiconductor film while moving the laser beam, and a region provided by being subjected to laser annealing by irradiating the laser beam to a region including a portion of the first crystalline region while moving the laser beam. Further, in the specification, a crystalline region indicates a region crystallized by irradiating the linear beam while moving the linear beam. However, the shape of laser beam at an irradiated face or in the vicinity thereof is not limited to linear but may be rectangular. As has already been described, when the linear beam is used, the productivity is high and accordingly, the linear beam is particularly preferable. Further, according to the invention, in carrying out laser annealing for a large area substrate, it is not necessary to expand the length of the laser beam in the longitudinal direction in compliance with the size of the large area substrate and therefore, the laser annealing is particularly effective, further, it is not necessary to newly prepare an optical system to comply with the size of the large area substrate, which is economical.

FIG. 3 shows absorption coefficients of an amorphous silicon film and a polycrystal silicon film with respect to wavelength. The wavelength of excimer laser is 308 nm and accordingly, in view of FIG. 3, the absorption coefficient of the amorphous silicon film is $1.38 \times 10^6$ cm$^{-1}$ and the absorption coefficient of the polycrystal silicon film is $1.56 \times 10^6$ cm$^{-1}$. Meanwhile, a wavelength of the second harmonic of YAG laser is 532 nm and accordingly, the absorption coefficient of the amorphous silicon film is $9.31 \times 10^4$ cm$^{-1}$ and the absorption coefficient of the polycrystal silicon film is $2.74 \times 10^4$ cm$^{-1}$.

It is known from the above-described that although degrees of absorption of the excimer laser with respect to the amorphous silicon film and the polycrystal silicon film are the same, however, the second harmonic of the YAG laser is more liable to be absorbed by the amorphous silicon film than the polycrystal silicon film. That is, when laser annealing is carried out for the amorphous silicon film by using the second harmonic of the YAG laser, a crystalline silicon film crystallized by laser annealing remains almost unchanged even when the crystalline silicon film is subjected again to laser annealing by the second harmonic of the YAG laser.

Excimer laser is provided with a large output and can oscillate highly repeated pulses of about 300 Hz in the current state and accordingly, the excimer laser is frequently used in crystallizing a semiconductor film. In recent years, in fabricating a liquid crystal display of a low-temperature polysilicon TFT in which the reduction to product has been progressed, excimer laser is used in a step of crystallizing a semiconductor film. Further, not only excimer laser but also Ar laser, YAG laser, YVO$_4$ laser or YLF laser can be used.

Here, an explanation will be given of a method of subjecting an amorphous silicon film to laser annealing by using second harmonic of YAG laser. Similar to the conventional technology, by using the optical system as shown by FIG. 1, laser beam of second harmonic YAG laser is shaped into linear beam having a linear shape at an irradiated face. A crystalline silicon film is provided by irradiating the linear beam to the amorphous silicon film while moving a stage in a direction orthogonal to the longitudinal direction of the linear beam.

As has already been described, the absorption coefficient of the second harmonic of YAG laser with respect to the amorphous silicon film is $9.31 \times 10^4$ cm$^{-1}$ and the absorption coefficient of the polycrystal silicon film is $2.74 \times 10^4$ cm$^{-1}$. Therefore, the second harmonic of YAG laser is absorbed by the amorphous silicon film more than the polycrystal silicon film. That is, when laser annealing is carried out by using the second harmonic of YAG laser, an amorphous region can be crystallized without effecting adverse influence on a region which has already been crystallized and a crystalline semiconductor film having excellent uniformity can be provided.

Here, a description will be given of a case in which an amorphous silicon film formed above a large area substrate as shown by FIG. 4A and FIG. 27A is subjected to laser annealing. As has already been described, the second harmonic of YAG laser is absorbed by the amorphous silicon film more than a polycrystal silicon film. Therefore, although the central portion of the substrate of FIG. 4A and FIG. 27A, is twice subjected to laser annealing by scanning the linear beam (or moving a position of irradiating the linear beam relative to an irradiated face), even when second irradiation is carried out, crystalline performance constituted by first irradiation remains almost unchanged. Therefore, even at a region in which laser beam is irradiated over a plurality of times as in the central portion of the substrate of FIG. 4A and FIG. 27A, or a region in which laser beam is irradiated only once, a crystalline silicon film having excellent crystalline performance can be provided. When TFT is fabricated by using the crystalline silicon film and electric properties are measured, excellent characteristics are provided even at the central portion of the substrate.

Next, an explanation will be given of a pitch of overlapping in the beam width of the linear beam. Second harmonic of YAG laser is shaped into laser beam having a linear shape at an irradiated face or in the vicinity thereof by using the optical system as shown by FIG. 1 and the laser is irradiated to the amorphous silicon film. At this occasion, an optimum value of the pitch of overlapping in the beam width of the linear beam differs by a film thickness of the amorphous silicon film. For example, there is a method in which the pitch of overlapping in the beam width of the linear beam is set to about ⅓ of the beam width of the linear beam as shown by FIG. 2B or a method in which the pitch is set to about ½ of the beam width as shown by FIG. 2C.

Meanwhile, YAG laser is provided with strong coherence, it is difficult to shape beam thereof and it is difficult to shape YAG laser into linear beam. However, as has already been described, since the second harmonic of YAG laser is more liable to be absorbed by the amorphous silicon film than a polycrystal silicon film, even when a region which has been crystallized once into a polycrystal silicon film, is subjected again to laser annealing by the second harmonic of YAG laser, the region remains almost unchanged. From the above-described, a shape of laser beam at an irradiated face or in the vicinity thereof not necessarily needs to be linear. However, energy of laser beam at the irradiated face is preferably uniform.

Further, laser used in the invention is not limited to the second harmonic of YAG laser. Wavelength of irradiated laser beam may fall in a range of 370 nm through 650 nm in which the laser beam is more likely to be absorbed by an amorphous silicon film than a polycrystal silicon film in view of FIG. 3.

Further, as an amorphous semiconductor film, there is an amorphous semiconductor film or a microcrystalline semiconductor film and other than the amorphous silicon film, there is applicable a compound semiconductor film having an amorphous structure such as an amorphous silicon germanium film.

BRIEF DESCRIPTION OF THE DRAWINGS

FIG. 1 is a view showing a conventional optical system for forming linear beam;

FIG. 5 is a view showing an example of introducing a beam expander to a constitution of FIG. 1;

FIGS. 7A, 7B, 7C and 7D are sectional views showing steps of fabricating pixel TFT and TFT of a drive circuit;

FIGS. 8A, 8B and 8C are sectional views showing steps of fabricating pixel TFT and TFT of a drive circuit;

FIGS. 9A and 9B are sectional views showing steps of fabricating pixel TFT and TFT of a drive circuit;

FIGS. 10A and 10B are sectional views showing steps of fabricating pixel TFT and TFT of a drive circuit;

FIGS. 16A and 16B are sectional views showing steps of fabricating an active matrix type liquid crystal display apparatus;

FIGS. 24A, 24B, 24C, 24D, 24E and 24F are views showing examples of semiconductor apparatus;

DESCRIPTION OF THE PREFERRED EMBODIMENTS

Embodiment 1

According to the embodiment, an explanation will be given of a case of forming an amorphous silicon film by a sputtering apparatus and carrying out laser annealing by using second harmonic (wavelength: 532 nm) of YAG laser having a cylindrical rod shape.

As a substrate, there is prepared a Corning 1737 substrate of 320 mm×400 mm having a thickness of 0.7 mm. A silicon oxynitride film having a thickness of 200 nm is formed above the substrate by using a plasma CVD apparatus and an amorphous silicon film having a thickness of 50 nm is formed above a surface of the silicon oxynitride film by using a sputtering apparatus.

Thereafter laser annealing is carried out by using second harmonic of YAG laser to thereby crystallize the amorphous semiconductor film. When a rod shape of YAG laser used at this occasion is cylindrical, a shape of the beam becomes circular. Therefore, when the shape of the beam is formed into an ellipse by putting a beam expander constituted by two sheets of cylindrical lenses 71 and 72 after the laser oscillator of FIG. 1 as shown by FIG. 5, it is easy to shape linear beam.

Figure 2A:
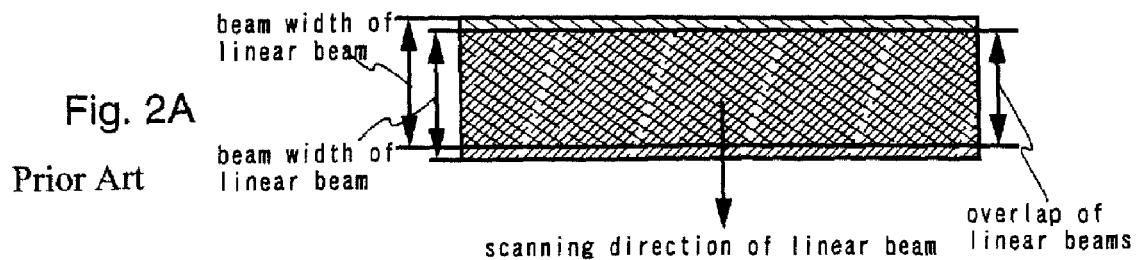
FIGS. 2A, 2B, 2C and 2D are views showing an example of a pitch of overlapping linear beam when the linear beam is irradiated by two pulses.
Figure 2B:
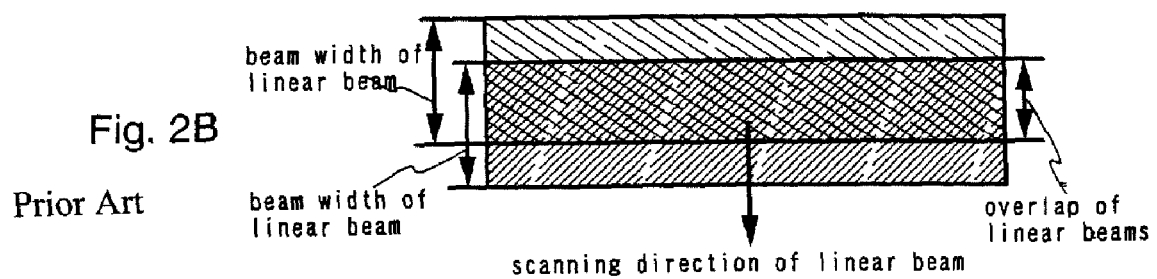
Figure 2C:
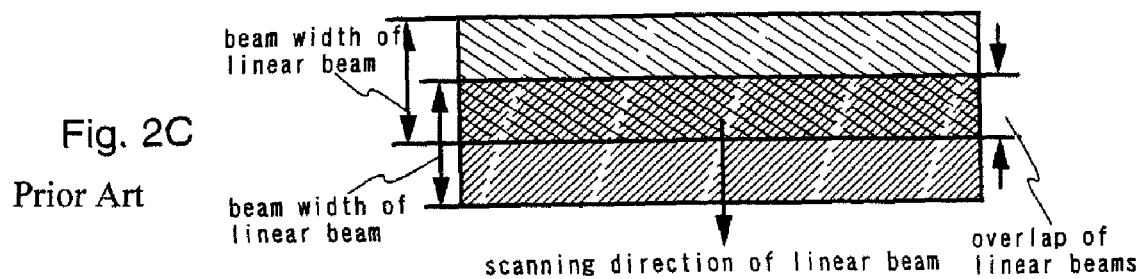
Figure 2D:
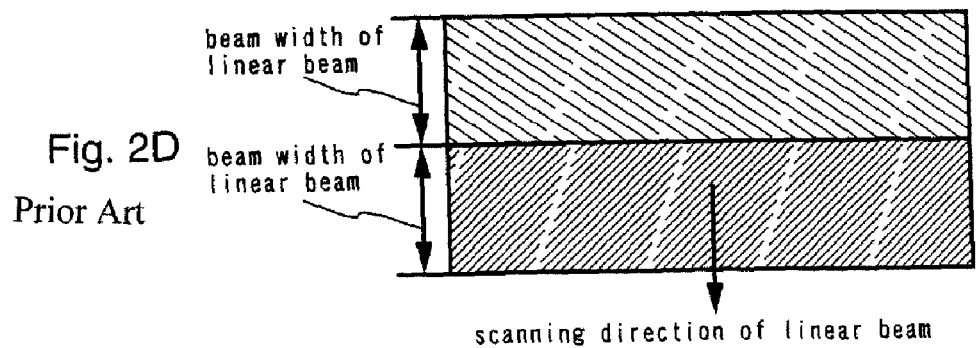
Figure 3:
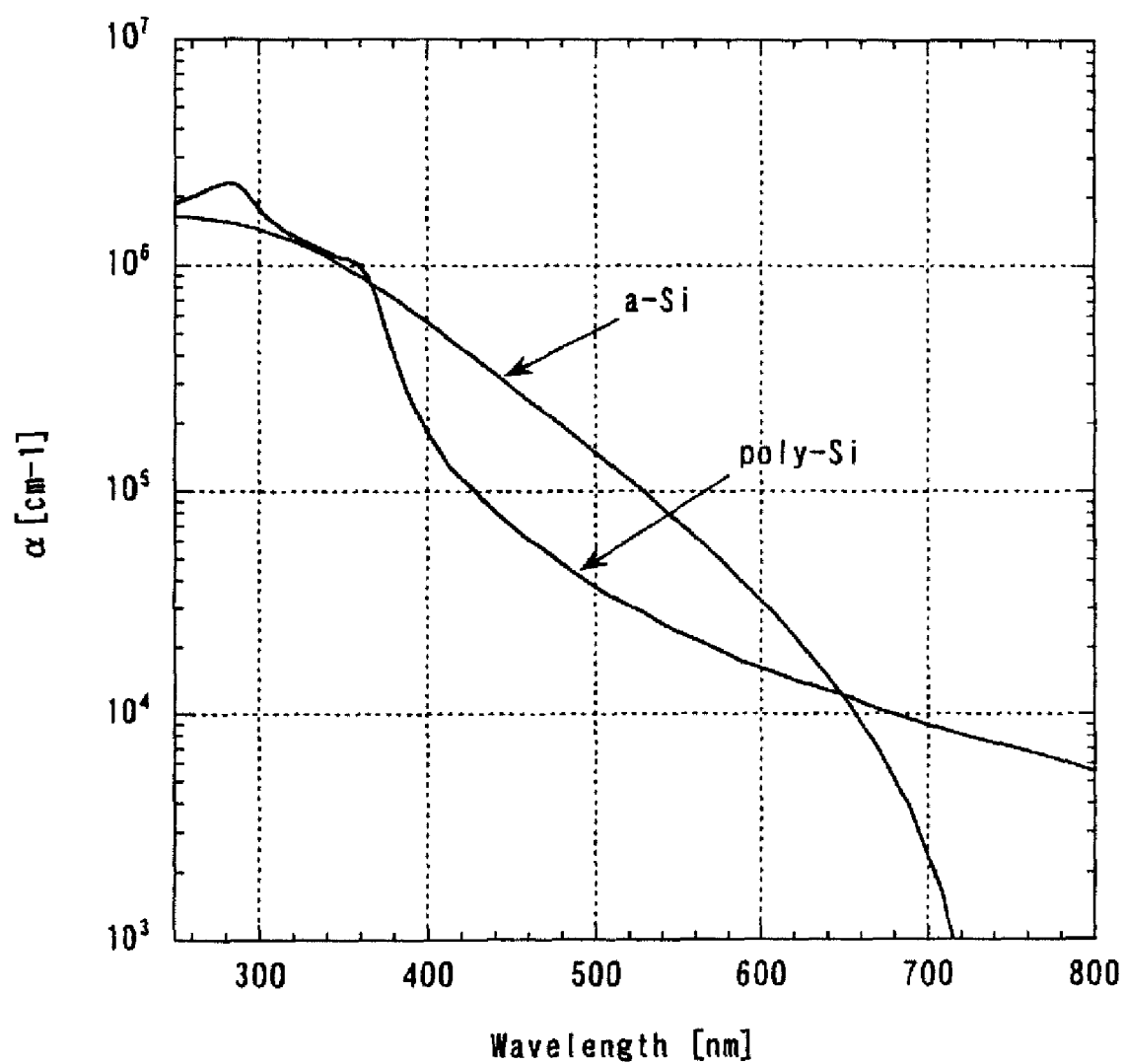
FIG. 3 is a diagram showing absorption coefficients of an amorphous silicon film and a polycrystal silicon film with respect to wavelength.
Figure 4A:
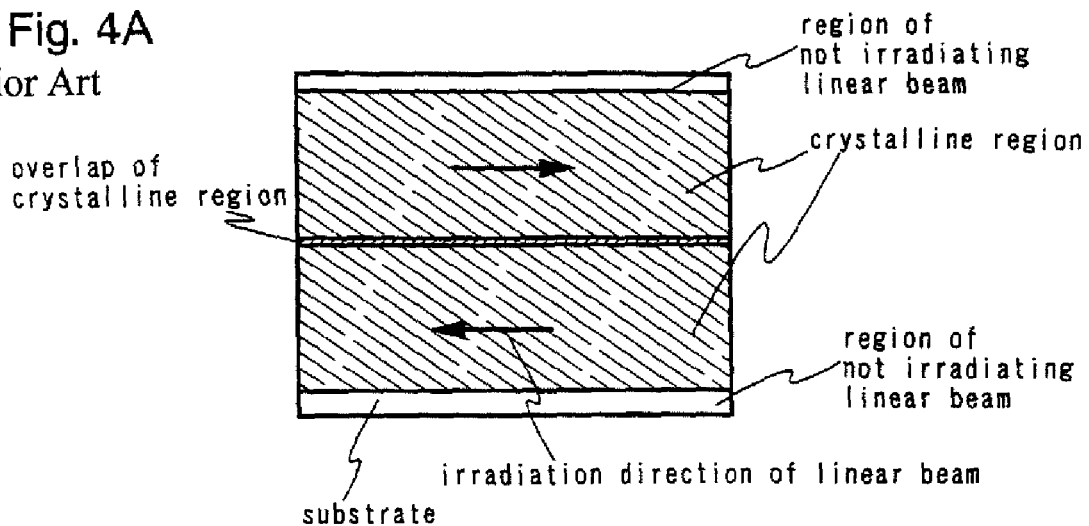
FIGS. 4A, 4B and 4C are views showing an example of a method of irradiating linear beam to a large area substrate.
Figure 4B:
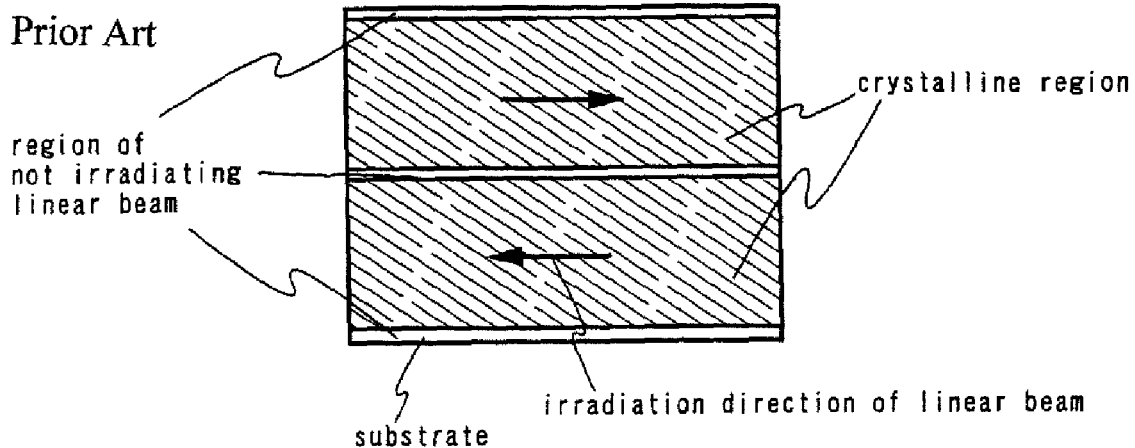
Figure 4C:
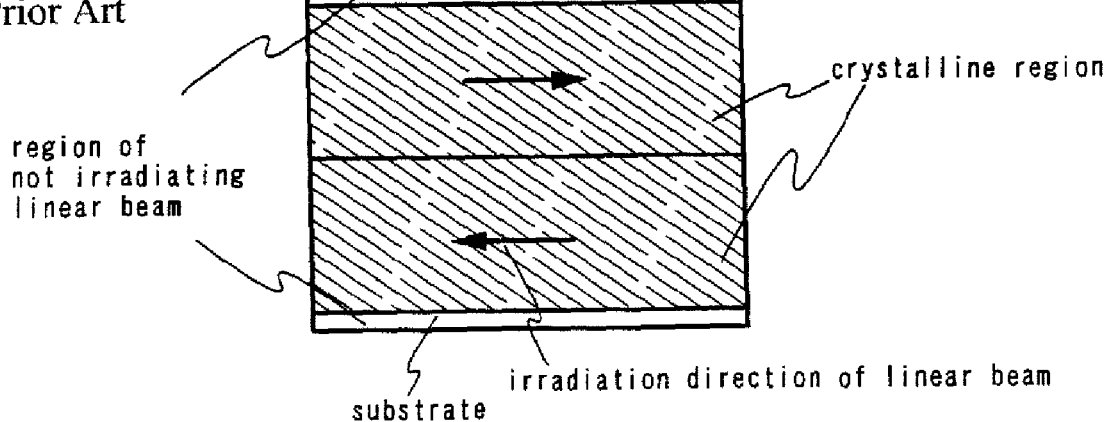

As shown by FIG. 3, according to the second harmonic (wavelength: 532 nm) of YAG layer, an absorption rate of amorphous silicon is higher than that of polycrystal silicon. Therefore, even at a first region irradiated with the linear beam while moving the linear beam and a second region including a portion of the first region irradiated with the linear beam while moving the linear beam, an amorphous region can be crystallized without deteriorating a shape of a continuous crystalline region provided in the first region and a crystalline silicon film having excellent crystalline performance can be provided.

By using the crystalline silicon film fabricated in this way, TFT is fabricated by, for example, a known method or a method shown by later embodiments. Electric properties of the TFT are excellent and the TFT having properties with small variation is provided.

Embodiment 2

According to the embodiment, an explanation will be given of a case of forming an amorphous silicon film by a sputtering apparatus and carrying out laser annealing by using second harmonic (wavelength: 532 nm) of YAG laser having a rod shape in a shape of a slab.

As a substrate, there is prepared a Corning 1737 substrate of 320 mm×400 mm having a thickness of 0.7 mm. A silicon oxynitride film having a thickness of 200 nm is formed above the substrate by using a plasma CVD apparatus and an amorphous silicon film having a thickness of 50 nm is formed above a surface of the silicon oxynitride film by using a sputtering apparatus.

Thereafter, laser annealing is carried out by using second harmonic of YAG laser to thereby crystallize the amorphous semiconductor film. When the rod shape of YAG laser used at this occasion, is a shape of a slab, provided beam shape is rectangular and therefore, the beam can be shaped into linear beam by using the optical system of FIG. 1 as it is.

As shown by FIG. 3, according to the second harmonic (wavelength: 532 nm) of YAG laser, the absorption rate of amorphous silicon is higher than that of polycrystal silicon. Therefore, even at a first region irradiated with the linear beam while moving the linear beam and a second region including a portion of the first region irradiated with the linear beam while moving the linear beam, an amorphous region can be crystallized without deteriorating the shape of a continuous crystalline region provided in the first region and a crystalline silicon film having excellent crystalline performance can be provided.

By using the crystalline silicon film fabricated in this way, TFT is fabricated by, for example, a known method or a method shown in later embodiments. Electric properties of TFT are excellent and the TFT having properties with small dispersion is provided.

Embodiment 3

According to the embodiment, an explanation will be given of a case of forming an amorphous silicon film by a CVD apparatus, carrying out a heating treatment to thereby partially crystallize the amorphous silicon film and thereafter carrying out laser annealing by using second harmonic (wavelength: 532 nm) of YAG laser.

As a substrate, there is prepared a Corning 1737 substrate of 320 mm×400 mm having a thickness of 0.7 mm. A silicon oxynitride film having a thickness of 200 nm is formed above the substrate by using a plasma CVD apparatus and successively, an amorphous silicon film having a thickness of 50 nm is formed above a surface of the silicon oxynitride film by using a plasma CVD apparatus. There is coated a solution including an element assisting crystallization on the amorphous silicon film. When as the solution, for example, a solution of nickel acetate is used, the nickel acetate solution (weight equivalent concentration: 10 ppm) is coated on an entire face of the film by spin coating.

Next, the substrate is heated at temperature of 500° C. for 1 hour in a nitrogen atmosphere and is heated at temperature of 550° C. for 4 hours in a nitrogen atmosphere. Thereafter, laser annealing is carried out by using the second harmonic of YAG laser to thereby crystallize the amorphous semiconductor film. When a rod shape of YAG laser used at this occasion, is cylindrical, the shape of the beam becomes circular. Therefore, when the shape of the beam is shaped into an ellipse by inputting the beam expander constituted by two sheets of the cylindrical lenses 71 and 72 after the laser oscillator of FIG. 1 as shown by FIG. 5, it is easy to shape the beam into linear beam. Further, when the rod shape of YAG laser used at this occasion, is a shape of a slab, the provided beam shape is rectangular and therefore, the beam can be shaped into linear beam by using the optical system of FIG. 1 as it is.

As shown by FIG. 3, according to the second harmonic (wavelength: 532 nm) of YAG laser, the absorption rate of amorphous silicon is higher than that of polycrystal silicon. Therefore, even at a first region irradiated with the linear beam while moving the linear beam and a second region including a portion of the first region irradiated with the linear beam while moving the linear beam, the amorphous region can be crystallized without deteriorating a shape of a continuous crystalline region provided in the first region and a crystalline silicon film having excellent crystalline performance can be provided.

By using the crystalline silicon film fabricated in this way, TFT is fabricated by, for example, a known method or a method shown in later embodiments. Electric properties of the TFT are excellent and the TFT having properties with small dispersion is provided.

Embodiment 4

According to the embodiment, an explanation will be given of an example of a case of carrying out laser annealing by using second harmonic (wavelength: 532 nm) of $YVO_4$ laser.

$YVO_4$ laser is characterized in having high quality of laser beam and $M^2$ which is one index representing quality of laser beam is very near to 1.

As in Embodiment 1, there is prepared a Corning 1737 substrate of 320 mm×400 mm having a thickness of 0.7 mm, a silicon oxynitride film having a thickness of 200 nm is formed above the substrate by using a plasma CVD apparatus and an amorphous silicon film having a thickness of 50 nm is formed above a surface of the silicon oxynitride film by using a sputtering apparatus. Laser annealing is carried out by irradiating laser beam of the second harmonic of $YVO_4$ laser to the amorphous silicon film and an explanation will firstly be given of the example of shaping the laser beam of the second harmonic of $YVO_4$ laser into linear beam in reference to FIG. 6.

Figure 6:
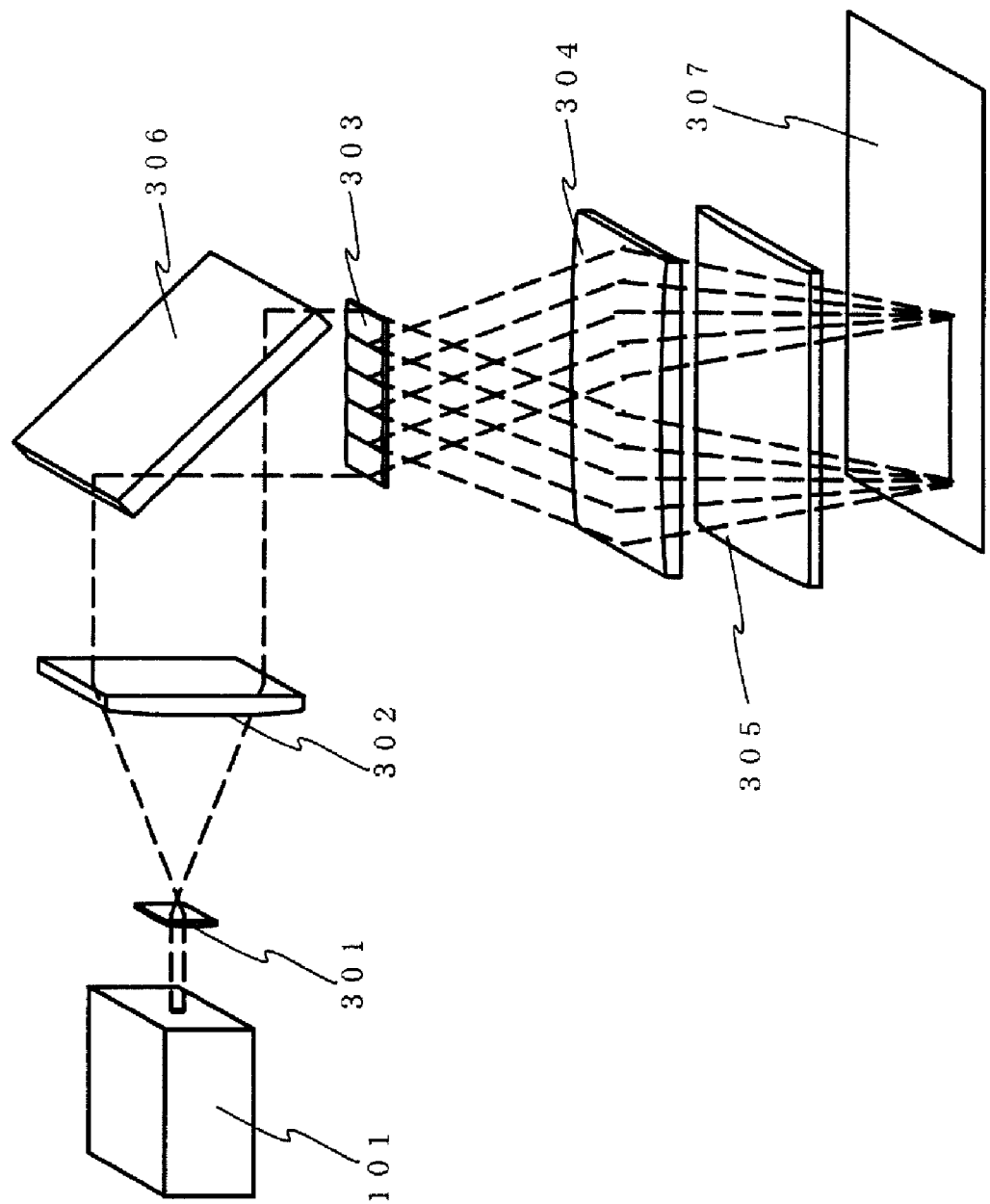
FIG. 6 is a view showing an optical system for forming linear beam.

In FIG. 6, firstly, beam is expanded in one direction by a beam expander constituted by cylindrical lenses 301 and 302, successively, the beam is split by a cylindrical array lens 303 and beam having a length of 5 mm is formed at an irradiated face by a focusing cylindrical lens 304. A cylindrical lens 305 is arranged orthogonally to the cylindrical lens 304 and a beam width is set to 0.1 mm. Incidentally, although a mirror 306 is arranged immediately after the beam expander, the mirror 306 is not necessarily needed.

In this way, the beam is shaped into linear beam having a linear shape at an irradiated face or in the vicinity thereof and therefore, the linear beam is scanned on the amorphous silicon film to thereby crystallize the amorphous silicon film.

As shown by FIG. 3, according to the second harmonic (wavelength: 532 nm) of $YVO_4$ laser, the absorption rate of amorphous silicon is sufficiently higher than that of polycrystal silicon. Therefore, even at a first region irradiated with the linear beam while moving the linear beam and a second region including a portion of the first region irradiated with the linear beam while moving the linear beam, an amorphous region can be crystallized without deteriorating a shape of a continuous crystalline region provided in the first region and a crystalline silicon film having excellent crystalline performance can be provided.

By using the crystalline silicon film fabricated in this way, TFT is fabricated by, for example, a known method or a method shown in later embodiments. Electric properties of the TFT are excellent and the TFT having properties with small dispersion is provided.

Embodiment 5

According to the embodiment, an explanation will be given of an example of a case of carrying out laser annealing by using second harmonic (wavelength: 527 nm) of YLF laser.

According to the second harmonic of YLF laser, a size of laser beam at an outlet can be made about 5 mm in diameter. Therefore, adjustment of a shape or an energy density of laser beam, is far easier than that in other laser beam the shape of which is nearly equal to a point light source.

As shown in Embodiment 1, there is prepared a Corning 1737 substrate of 320 mm×400 mm having a thickness of 0.7 mm, a silicon oxynitride film having a thickness of 200 nm is formed above the substrate by using a plasma CVD apparatus and an amorphous silicon film having a thickness of 50 nm is formed above a surface of the silicon oxynitride film by using a sputtering apparatus. Thereafter, similar to Embodiment 4, by using the optical system shown in FIG. 6, the laser beam is shaped into linear beam and the linear beam is irradiated to the amorphous silicon film.

As shown by FIG. 3, according to the second harmonic (wavelength: 527 nm) of YLF laser, the absorption rate of amorphous silicon is higher than that of polycrystal silicon. Therefore, even at a first region irradiated with the linear beam while moving the linear beam and a second region including a portion of the first region irradiated with the linear beam while moving the linear beam, an amorphous region can be crystallized without deteriorating a shape of a continuous crystalline region provided in the first region and a crystalline silicon film having excellent crystalline performance can be provided.

By using the crystalline silicon film fabricated in this way, TFT is fabricated by, for example, a known method or a method shown in later embodiments. Electric properties of the TFT are excellent and the TFT having characteristics with small variation is provided.

Embodiment 6

An explanation will be given of an embodiment of the invention in reference to FIG. 7A through FIG. 9B. Here, a detailed explanation will be given of a method of simultaneously forming pixel TFT and a storage capacitor of a pixel portion and TFT of a drive circuit provided at a periphery of the pixel portion step by step.

In FIG. 7A, as a substrate 101, there is used a glass substrate of barium borosilicate glass or aluminoborosilicate glass represented by #7059 glass or #1737 glass of Corning Corporation or a quartz substrate. When a glass substrate is used, the glass substrate may previously be subjected to a heat treatment at temperature lower than the glass strain point by about 10° C. through 20° C. Further, at a surface of the substrate 101 for forming TFT, in order to prevent diffusion of impurities from the substrate 101, there is formed a matrix film 102 comprising an insulating film such as a silicon oxide film, a silicon nitride film or a silicon oxynitride film. For example, according to a plasma CVD process, a silicon oxynitride film 102a fabricated from $SiH_4$, $NH_3$, $N_2O$, is formed to laminate by 10 nm through 200 nm (preferably, 50 nm through 100 nm) and similarly, an oxynitrohydrogenated film 102b fabricated from $SiH_4$, $N_2O$, is formed to laminate by a thickness of 50 nm through 200 nm (preferably, 100 nm through 150 nm). Although in this case, there is shown the matrix film 102 in a two-layer structure, the matrix film 102 may be formed by laminating a single layer or two layers or more of the insulating film.

The silicon oxynitride film is formed by using a plasma CVD process of a parallel plate type. In forming the silicon oxynitride film 102a, there are introduced 10 SCCM of $SiH_4$, 100 SCCM of $NH_3$ and 20 SCCM of $N_2O$ into a reaction chamber, substrate temperature is set to 325° C., reaction pressure is set to 40 Pa, a charge power density is set to 0.41 W/cm$^2$ and a discharge frequency is set to 60 MHz. On the other hand, in forming the silicon oxynitrohydrogenated film 102b, there are introduced 5 SCCM of $SiH_4$, 120 SCCM of $N_2O$ and 125 SCCM of $H_2$ into a reaction chamber and substrate temperature is set to 400° C., reaction pressure is set to 20 Pa, a discharge power density is set to 0.41 W/cm$^2$ and a discharge frequency is set to 60 MHz. These films can continuously be formed by changing the substrate temperature and switching reaction gases.

The silicon oxynitride film 102a fabricated in this way is a dense and hard film having a total atom number per unit volume of $9.28 \times 10^{22}/cm^3$ and an etching rate at 20° C. of a mixed solution (made of Stellachmifer Co. Ltd., commercial name LAL500) including 7.13% of ammonium hydrogenfluoride ($NH_4HF_2$) and 15.4 of ammonium fluoride ($NH_4F$), is as slow as about 63 nm/min. When such a film is used as the matrix film, the film is effective in preventing alkaline metal elements from the glass substrate from diffusing to a semiconductor layer formed thereabove.

Next, there is formed a semiconductor layer 103a having an amorphous structure by a thickness of 25 nm through 100 nm (preferably, 30 nm through 70 nm) by a method such as a plasma CVD method or a sputtering method. As the semiconductor film having the amorphous structure, there is an amorphous semiconductor layer or a microcrystalline semiconductor layer and a compound semiconductor film having an amorphous structure such as an amorphous silicon germanium film may be applicable. When the amorphous silicon film is formed by a plasma CVD process, both of the matrix film 102 and the amorphous semiconductor layer 103a can continuously be formed. For example, after forming the silicon oxynitride film 102a and the silicon oxynitrohydrogenated film 102b continuously by a plasma CVD process, when reaction gases are switched from $SiH_4$, $N_2O$, $H_2$ to $SiH_4$ and $H_2$ or only $SiH_4$, the matrix film 102 and the amorphous semiconductor layer 103a can continuously be formed without being exposed to the atmosphere once. As a result, contamination of a surface of the oxynitrohydrogenated silicon film 102b can be prevented and a dispersion in properties or a variation in threshold voltage of fabricated TFT can be reduced.

Further, a crystalline semiconductor layer 103b is fabricated from the amorphous semiconductor layer 103a by carrying out a step of crystallization. As a method therefor, a laser annealing process, a thermal annealing process (solid phase growing process) or a rapid thermal annealing process (RTA process) is applicable. When a glass substrate, as described above, or a plastic substrate having inferior heat resistance is used, it is preferable to particularly apply the laser annealing process of the invention. According to the RTA process, there is used an infrared ray lamp, a halogen lamp, a metal halide lamp, a xenon lamp as a light source. Or, the crystalline semiconductor layer 103b can be formed by a crystallizing process using a metal element in accordance with a technology disclosed in Japanese Patent Laid-Open No. 130652/1995. Further, the crystalline semiconductor layer 103b can also be formed by carrying out both of the laser annealing process and the crystallizing process using a metal element. In the step of crystallization, it is preferable to firstly discharge hydrogen included in the amorphous semiconductor layer and when the amorphous semiconductor layer is crystallized by carrying out a heat treatment at 400° C. through 500° C. for about 1 hour to thereby make an amount of included hydrogen to be equal to or smaller than 5% of a total atom number included in the amorphous semiconductor layer, roughing of the surface of the film can be prevented, which is preferable.

Further, in the step of forming the amorphous silicon film by the plasma CVD process, when the film is formed by using a $SiH_4$ and argon (Ar) as reaction gases and setting substrate temperature in forming the film to 400° C. through 450° C., a concentration of hydrogen included in the amorphous silicon layer can be made to be equal to or smaller than 5% of a total atom number included in the amorphous silicon layer. In such a case, a heat treatment for discharging hydrogen is dispensed with.

In crystallization, any of the methods shown in Embodiment 1 through Embodiment 5 is applicable. In this way, the crystalline semiconductor layer 103b as shown by FIG. 7B can be provided.

Further, a resist pattern is formed above the crystalline semiconductor layer 103b by using a first photomask (PM1) and using the technology of photolithography, the crystalline semiconductor layer is divided into an island-like shape by dry etching and as shown by FIG. 7C, there are formed island-like semiconductor layers 103 through 108. In dry etching of the crystalline semiconductor film, a mixed gas of $CF_4$ and $O_2$ is used.

With respect to such an island-like semiconductor layer, with an object of controlling threshold voltage (Vth) of TFT, an impurity element for providing p type may be added to an entire face of the island-like semiconductor layer by a concentration of about $1\times10^{16}/cm^3$ through $5\times10^{17}/cm^3$. As an impurity element providing p type to a semiconductor, there is known an element of 13th group of the periodic table such as boron (B), aluminum (Al) or gallium (Ga). As a method therefor although an ion implantation process or an ion doping process (or ion shower doping process) can be used, the ion doping process is suitable for processing a large area substrate. According to the ion doping process, there is added boron (B) using diborane ($B_2H_6$) as a source gas. Although such implantation of an impurity element is not necessarily needed but may be dispensed with, this is a method preferably used for confining threshold voltage of an n-channel type TFT in a predetermined range.

A gate insulting film 109a is formed by an insulating film including silicon having a film thickness of 40 nm through 150 nm by using a plasma CVD process or a sputtering process. According to the embodiment, the gate insulating film 109a is formed by a silicon oxynitride film having a thickness of 120 nm. Further, according to the silicon oxynitride film fabricated by adding $O_2$ to $SiH_4$ and $N_2O$, a fixed electric charge density in the film is reduced and accordingly, the film constitutes a material preferable for the use. Further, the silicon oxynitride film fabricated from $SiH_4$ and $N_2O$ and $N_2$, is preferable since a defect density at an interface with the gate insulating film can be reduced. Naturally, the gate insulating film is not limited such silicon oxynitride film but a single layer or a laminated structure of other insulating film including silicon may be used. For example, when a silicon oxide film is used, the film can be formed by mixing TEOS (Tetraethyl orthosilicate) and $O_2$, setting reaction pressure to 40 Pa, setting substrate temperature to 300° C. through 400° C. and discharging by a plasma CVD process with a high frequency (13.56 MHz) and a power density of 0.5 W/cm² through 0.8 W/cm². The silicon oxide film fabricated in this way, can be provided with excellent properties as the gate insulating film by thereafter carrying out thermal annealing at 400° C. through 500° C.

Further, as shown by FIG. 7D, there is formed a heat-resistant conductive layer 111 in a thickness of 200 nm through 400 nm (preferably, 250 nm through 350 nm) for forming a gate electrode above the gate insulating film 109a having a first shape. The heat-resistant conductive layer may be formed by a single layer or may be formed by a laminated structure comprising a plurality of layers such as two layers or three layers as necessary. According to the heat-resistant conductive layer of the specification, there is included an element selected from Ta, Ti and W or an alloy having a component of the element or an alloy film combining the elements. These heat-resistant conductive layers are formed by a sputtering process or a CVD process, it is preferable to reduce a concentration of an included impurity to achieve low resistance formation and particularly, with regard to a concentration of oxygen, the concentration is preferably equal to or smaller than 30 ppm. According to the embodiment, a W film is formed by a thickness of 300 nm. The W film may be formed by a sputtering process with W as a target or can be formed by a thermal CVD process by using tungsten hexafluoride ($WF_6$). In any of the cases, it is necessary to achieve low resistance formation for being used as a gate electrode and it is preferable that the resistivity of the W film is equal to or smaller than 20 μΩcm. Although low resistivity formation can be achieved by enlarging crystal grains of the W film, when there is a large amount of an impurity element such as oxygen in the W film, the crystallization is hampered and high resistance formation is constituted. Therefore, in the case of the sputtering process, by forming the W film by using a W target having the purity of 99.9999% and sufficiently giving a consideration such that an impurity from a gas phase is not mixed in forming the film, resistivity of 9 μΩcm through 20 μΩcm can be realized.

Meanwhile, when a Ta film is used as the heat-resistant conductive layer 111, the film can be formed similarly by a puttering process. Ar is used as a puttering gas in forming the Ta film. Further, when a pertinent amount of Xe or Kr is added to a gas in sputtering, the formed film can be prevented from being exfoliated by relaxing internal stress thereof. Although resistivity of the Ta film in a phase is about 20 μΩcm, which can be used for the gate electrode, resistivity of the Ta film in β phase is about 180 μΩcm, which is not preferable for constituting the gate electrode. A conductive nitride is provided with a crystalline structure near to a phase and accordingly, when a TaN film is formed at the matrix of the Ta film, the Ta film having the a phase can easily be provided. Further, although not illustrated, it is effective to form a silicon film doped with phosphor (P) below the heat-resistant conductive layer 111 by a thickness of about 2 nm through 20 nm. Thereby, promotion of adherence and prevention of oxidation of a conductive film formed thereabove, are achieved and at the same time, an alkaline metal element included in the heat-resistant conductive layer 111 by a small amount can be prevented from diffusing to the gate insulating film 109a having the first shape. In any of the cases, it is preferable that the heat-resistant conductive layer 111 is provided with resistivity in a range of 10 μΩcm through 50 μΩcm.

Next, there are formed masks 112 through 117 by a resist by using a second photomask (PM2) and using the technology of photolithography. Further, a first etching processing is carried out. According to the embodiment, the first etching processing is carried out by using an ICP etching apparatus, using $Cl_2$ and $CF_4$ as etching gases and forming plasma by inputting RF (13.56 MHz) power of 3.2 W/cm² under pressure of 1 Pa. A substrate side (sample stage) is also inputted with RF (13.56 MHz) power of 224 mW/cm², thereby, substantially negative self bias voltage is applied. Under the condition, an etching rate of the W film is about 100 nm/min. In the first etching processing, based on the etching rate, a time period of just etching the W film is predicted and a time period of increasing an etching time period from the above-described time period by 20% is set to the etching time period.

By the first etching processing, there are formed conductive layers 118 through 123 having a first taper shape. An angle of a taper portion is formed to be 15° through 30°. In order to carry out etching without leaving residue, there is carried out overetching for increasing the etching time period by a rate of about 10% through 20%. A selection ratio of the W film to the silicon oxynitride film (gate insulating film 109a having the first shape) is 2 through 4 (representatively 3) and accordingly, by the overetching processing, an exposed face of the silicon oxynitride film is etched by about 20 nm through 50 nm and there is formed a gate insulating film 109b having a second shape formed with a taper shape in the vicinity of an end portion of the conductive layer having the first taper shape.

Further, a first doping process is carried out and an impurity element having one conductive type is added to the island-like semiconductor layer. In this case, there is carried out a step of adding an impurity element providing n type. While leaving the masks 112 through 117 forming the conductive layers having the first shape as they are, there is added, by an ion doping process, an impurity element providing n-type is added self-adjustingly with the conductive layers 118 through 123 having the first taper shape as masks. The first doping process is carried out by setting a dose amount to $1\times10^{13}$ through $5\times10^{14}/cm^2$ and setting acceleration voltage to 80 kV through 160 kV in order to add the impurity element for providing n-type via a taper portion at an end portion of the gate electrode and the gate insulating film to reach the semiconductor layer disposed therebelow. Although as the impurity element for providing n type, there is used an element pertaining to 15th group, typically, phosphor (P) or arsenic (As), in this case, phosphor (P) is used. By such an ion doping process, first impurity regions 124 through 132 are added with the impurity element for providing n type in a range of a concentration of $1\times10^{20}/cm^3$ through $1\times10^{21}/cm^3$ and a second impurity region (A) formed below the taper portion is added with the impurity element for providing n type in a range of a concentration of $1\times10^{17}/cm^3$ through $1\times10^{20}/cm^3$ although the concentration is not necessarily uniform in the region.

In this step, at the second impurity region (A) 129 through 133, a change in the concentration of the impurity element for providing n type included at portions overlapping the conductive layers 118 through 123 having the first shape, is reflected by a change in the film thickness in the taper portion. That is, according to the concentration of phosphor (P) added to the second impurity region (A) 129 through 133, at a region overlapping the conductive layer having the first shape, the concentration is gradually lowered from an end portion of the conductive layer to an inner side thereof. This is because the concentration of phosphor (P) reaching the semiconductor layer is changed by a difference in the film thickness of the taper portion.

Next, a second etching processing is carried out as shown by FIG. 8B. The etching processing is similarly carried out by an ICP etching apparatus, a mixed gas of $CF_4$ and $Cl_2$ is used as etching gases and etching is carried out by RF power of 3.2 W/cm² (13.56 MHz), bias voltage of 45 mW/cm² (13.56 MHz) and pressure of 1.0 Pa. There are formed conductive layers 140 through 145 having a second shape formed by the condition. An end portion of each thereof is formed with a taper portion and there is constituted a taper shape gradually increasing a thickness thereof from the end portion toward an inner side thereof. In comparison with the first etching processing, a rate of isotropic etching is increased by an amount of reducing the bias power applied to the substrate side and angle of the taper portion becomes 30° through 60°. Further, a surface of the gate insulating film 109b having the second shape is etched by about 40 nm and a gate insulating film 109c having a third shape is newly formed.

Further, an impurity element for providing n type is doped under a condition of high acceleration voltage by reducing a dose amount more than that in the first doping processing. For example, the acceleration voltage is set to 70 kV through 120 kV and the doping is carried out by the dose amount of $1\times10^{13}/cm^2$ such that an impurity concentration of regions overlapping the conductive layers 140 through 145 having the second shape becomes $1\times10^{16}/cm^3$ through $1\times10^{18}/cm^3$. In this way, second impurity regions (B) 146 through 150 are formed.

Further, there are formed impurity regions 156 and 157 having a conductive type reverse to the above-described conductive type at the island-like semiconductor layers 104 and 106 for forming p-channel type TFTs. Also in this case, an impurity element for providing p type is added with the conductive layers 140 and 142 having the second shape as masks and the impurity regions are formed self-adjustingly. At this occasion, the island-like semiconductor layers 105, 107 and 108 are formed with masks 151 through 153 of resists by using a third photomask (PM3) to thereby cover entire faces thereof. The impurity regions 156 and 157 formed at this stage, are formed by an ion doping process using diborance ($B_2H_6$). A concentration of tire impurity element for proving p type of the impurity regions 156 and 157 is set to $1\times10^{20}/cm^3$ through $2\times10^{21}/cm^3$.

The impurity regions 156 and 157 each can be regarded to classify into three regions including the impurity element for providing n type. Third impurity regions 156a and 157a include the impurity element for providing, n type at a concentration of $1\times10^{20}/cm^3$ through $1\times10^{21}/cm^3$, fourth impurity regions (A) 156b and 157b include the impurity element for providing n type at a concentration of $1\times10^{17}/cm^3$ through $1\times10^{20}/cm^3$ and fourth impurity regions (B) 156c and 157c include the impurity element for providing n type at a concentration of $1\times10^{16}/cm^3$ through $5\times10^{18}/cm^3$. However, by making the concentration of the impurity element for providing p type of the impurity regions 156b, 156c, 157b and 157c equal to or larger than $1\times10^{19}/cm^3$ and in the third impurity regions 156a and 157a, by increasing the concentration of the impurity element for providing p type by a multiplication factor of 1.5 through 3, the third impurity regions function as source regions and drain regions of p-channel type TFTs. Further, a portion of the fourth impurity region (B) 156c or 157c is formed to overlap a portion of the conductive layer 140 or 142 having the second taper shape.

Thereafter, as shown by FIG. 9A, a first interlayer insulating film 158 is formed from above the gate electrode and the gate insulating film. The first interlayer insulating film may be formed by a silicon oxide film, a silicon oxynitride film, a silicon nitride film or a laminated film combined with these. In any of the cases, the first interlayer insulating film 158 is formed by an inorganic insulating material. The film thickness of the first interlayer insulating film 158 is set to 100 nm through 200 nm. In this case, when the silicon oxide film is used, the film can be formed by mixing TEOS and $O^2$ in a plasma CVD process, setting reaction pressure to 40 Pa, setting substrate temperature to 300° C. through 400° C. and discharging by a high frequency (13.56 MHz) power density of 0.5 W/cm² through 0.8 W/cm². Further, when the silicon oxynitride film is used, the film may be formed by a silicon oxynitride film fabricated by $SiH_4$, $N_2O$, $NH_3$ by a plasma CVD process or a silicon oxynitride film fabricated from $SiH_4$, $N_2O$. Fabrication conditions in this case are set to reaction pressure of 20 Pa through 200 Pa and substrate temperature of 300° C. through 400° C. and the film can be formed at a high frequency (60 MHz) power density of 0.1 W/cm² through 1.0 W/cm². Further, an oxynitrohyrogenated silicon film fabricated from $SiH_4$, $N_2O$, $H_2$ may be applicable. Further, the silicon nitride film can be fabricated from $SiH_4$, $NH_3$ similarly by a plasma CVD process.

Further, there is carried out a step of activating the impurity element for providing n type or p type added by respective concentration. The step is carried out by a thermal annealing process using a furnace annealing furnace. Otherwise, a laser annealing process or a rapid thermal annealing process (RTA process) is applicable. The thermal annealing process is carried out at 400° C. through 700° C., representatively, 500° C. through 600° C. in a nitrogen atmosphere having an oxygen concentration equal to or smaller than 1 ppm, preferably, equal to or smaller than 0.1 ppm and according to the embodiment, there is carried out a heat treatment at 550° C. for 4 hours. Further, when a plastic substrate having low heat resistance temperature in the substrate 101, it is preferable to apply a laser annealing process.

Successive to the step of activation, atmospheric gas is changed and there is carried out a step of hydrogenating the island-like semiconductor layer by carrying out a heat treatment at 300° C. through 450° C. for 1 hour through 12 hours in an atmosphere including 3% through 100% of hydrogen. The step is the step of terminating dangling bonds of $10^{16}/cm^3$ through $10^{18}/cm^3$ present in the island-like semiconductor layer by thermally excited hydrogen. As other means of hydrogenation, plasma hydrogenation (using hydrogen excited by plasma) may be carried out. In any of the cases, it is preferable to make a defect density in the island-like semiconductor layers 104 through 108 equal to or smaller than $1\times10^{16}/cm^3$ and for that purpose, hydrogen of about 0.01% through 0.1% of a total atom number included in the island-like semiconductor layers may be provided.

Thereafter, a second interlayer insulating film 159 comprising organic resin is formed by a thickness of 1.0 μm through 1.5 μm. As the organic resin, polyimide, acrylic resin, polyamide, polyimide amide or BCB (benzocyclobutene) can be used. In this case, there is used polyimide of a type thermally polymerized after being coated on the substrate, which is formed by curing at 300° C.

By forming the second interlayer insulating film by an organic insulating material in this way, the surface can be flattened excellently. Further, an organic resin material is generally provided with low dielectric constant and therefore, parasitic capacitance can be reduced. However, the material is provided with hygroscopic property and is not suitable as a protective film and therefore, as in the embodiment, the material may be used to combine with the silicon oxide film, the silicon oxynitride film or the silicon nitride film formed as the first interlayer insulating film 158.

Thereafter, there is formed a contact hole which is respectively formed at the insulating semiconductor layer and reaching the impurity region for constituting the source region or the drain region by forming a resist mask having a predetermined pattern by using a fourth photomask (PM4). The contact hole is formed by a dry etching process. In this case, the second interlayer insulating film 159 comprising the organic resin material is firstly etched by using a mixed gas of $CF_4$, $O_2$ and He as etching gases and thereafter, the first interlayer insulating film 158 is etched by constituting etching gases by $CF_4$ and $O_2$. Further, by etching the gate insulating film 109c having the third shape by switching the etching gas to $CHF_3$ in order to increase a selection ratio with the island-like semiconductor layer, the contact hole can be formed.

Further, a conductive metal film is formed by a sputtering process or a vacuum deposition process, a resist mask pattern is formed by a fifth photomask (PM5) and source lines 160 through 164 and drain lines 165 through 168 are formed by etching. A pixel electrode 169 is formed along with the drain line. A pixel electrode 171 represents a pixel electrode belonging to a contiguous pixel. Although not illustrated, according to the embodiment, in forming the wiring, a Ti film is formed by a thickness of 50 nm through 150 nm, there are formed an impurity region for forming a source or a drain region of island-like semiconductor layer and a contact, an aluminum (Al) layer is formed by a thickness of 300 nm through 400 nm to overlap the Ti film (designated by notations 160a through 169a in FIG. 9B) and a transparent conductive film is formed thereabove by a thickness of 80 nm through 120 nm (designated by notations 160b through 169b in FIG. 9B). As the transparent conductive film, an alloy of indium oxide and zinc oxide ($In_2O_3$—ZnO) or zinc oxide (ZnO) is a suitable material therefor, further, zinc oxide added with gallium (Ga) (ZnO:Ga) can preferably be used for promoting transmittance of visible light or conductivity.

In this way, by five sheets of the photomasks, on the same substrate, a substrate having TFT of a drive circuit and pixel TFT of a pixel portion can be finished. In the drive circuit, there are formed a first p-channel type TFT 200, a first n-channel type TFT 201, a second p-channel type TFT 202, a second n-channel type TFT 203 and at the pixel portion, there are formed pixel TFT 204 and a storage capacitor 205. In this specification, such a substrate is referred to as active matrix substrate for convenience.

At the first p-channel type TFT 200 of the drive circuit, there is constructed a structure in which the conductive layer having the second taper shape is provided with the function as a gate electrode 220 and in the island-like semiconductor layer 104, there are formed a channel forming region 206, a third impurity region 207a functioning as a source region or a drain region, a fourth impurity region (A) 207b forming an LDD region which does not overlap the gate electrode 220 and a fourth impurity region (B) 207c a portion of which forms an LDD region overlapping the gate electrode 220.

At the first n-channel type TFT 201, there is constructed a structure in which the conductive layer having the second taper shape is provided with a function as a gate electrode 221 and in the island-like semiconductor layer 105, there are formed a channel forming region 208, a first impurity region 209a functioning as a source region or a drain region, a second impurity region (A) 209b forming an LDD region which does not overlap the gate electrode 221 and a second impurity region (B) 209c forming an LDD region a portion of which overlaps the gate electrode 221. Relative to the channel length of 2 μm through 7 μm, a length of a portion of the second impurity region (B) 209c overlapping the gate electrode 221 is set to 0.1 μm through 0.3 μm. The length is controlled by the thickness of the gate electrode 221 and the angle of the taper portion. By forming such LDD regions in the n-channel type TFT, hot carriers can be prevented from generating and TFT can be prevented from deteriorating by alleviating a high electric field generated at a vicinity of the drain region.

According to the second p-channel type TFT 202 of the drive circuit, similarly, there is constructed a structure in which the conductive layer having the second taper shape is provided with a function as a gate electrode 222 and at the island-like semiconductor layer 106, there are provided a channel forming region 210, a third impurity region 211a functioning as a source region or a drain region, a fourth impurity region (A) 211b forming an LDD region which does not overlap the gate electrode 222 and a fourth impurity region (B) 211c a portion of which forms an LDD region overlapping the gate electrode 222.

According to the second n-channel type TFT 203 of the drive circuit, there is constructed a structure in which the conductive layer having the second taper shape is provided with a function as a gate electrode 223 and at the island-like semiconductive layer 107, there are provided a channel forming region 212, a first impurity region 213a functioning as a source region or a drain region, a second impurity region (A) 213b forming an LDD region which does not overlap the gate electrode 223 and a second impurity region (B) 213c forming an LDD region a portion of which overlaps a gate electrode 223. Similar to the second n-channel type TFT 201, a length of a portion of the impurity region (B) 213c overlapping the gate electrode 223 is set to 0.1 μm through 0.3 μm.

The drive circuit is formed by a logic circuit such as a shift register or a buffer circuit and a sampling circuit formed by an analog switch. Although in FIG. 9B, TFT forming thereof is shown by a structure of a single gate having one gate electrode between a pair of a source and a drain, there may be constructed a multiple gate structure in which a plurality of gate electrodes are provided between a pair of a source and a drain.

According to the pixel TFT 204, there is constructed a structure in which the conductive layer having the second taper shape is provided with a function as gate electrodes 224 and at the island-like semiconductor layer 108, there are provided channel forming regions 214a and 214b, first impurity regions 215a and 217 each functioning as a source region or a drain region, a second impurity region (A) 215b forming an LDD region which does not overlap the gate electrode 224 and a second impurity region (B) 215c forming an LDD region a portion of which overlaps the gate electrode 224. A length of a portion of the second impurity region (B) 215c overlapping the gate electrode 224 is set to 0.1 µm through 0.3 µm. Further, there is formed a storage capacitor by the semiconductor layer extended from the first impurity region 217 and having a second impurity region (A) 219b, a second impurity region (B) 219c and a region 218 which is not added with an impurity element for determining conductive type, an insulating layer formed at a layer the same as the gate insulating film having the third shape and a capacitor wiring 225 formed by the conductive layer having the second taper shape.

Figure 15:
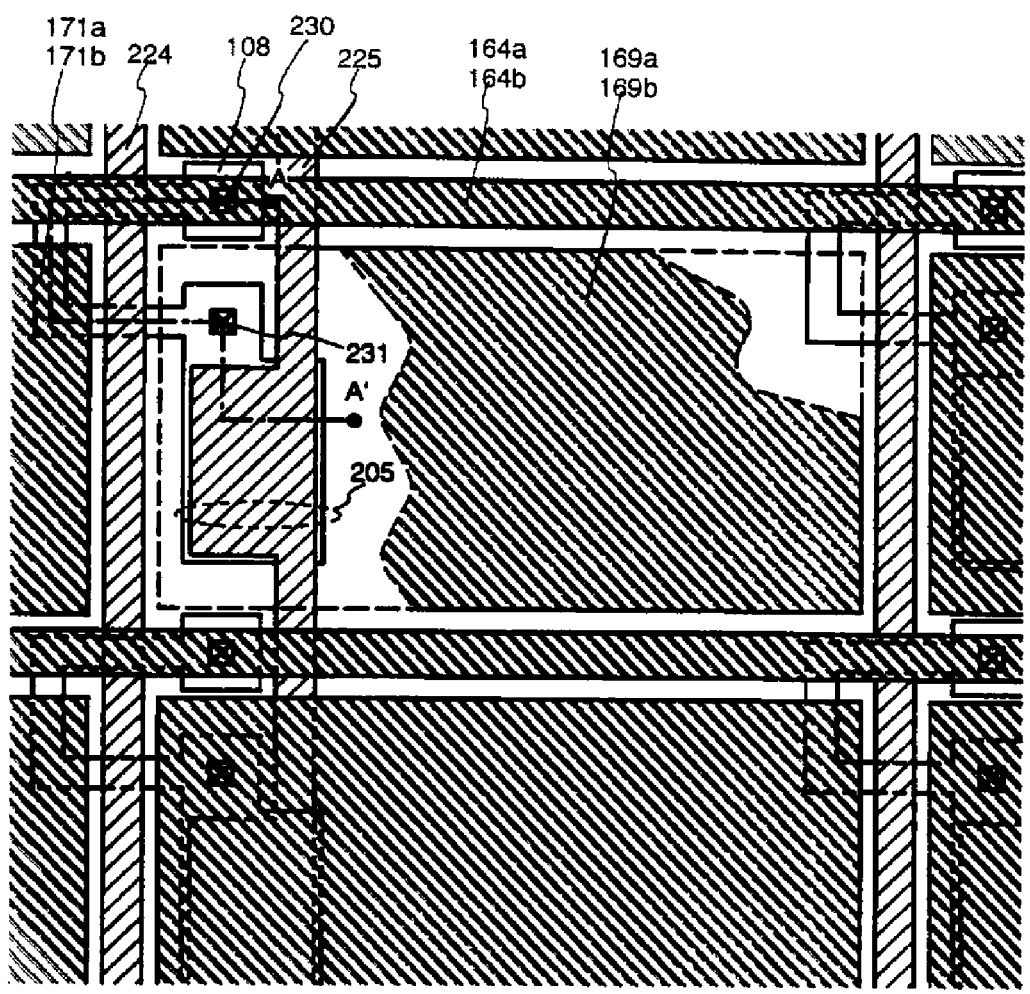
FIG. 15 is a top view showing a pixel of a pixel portion.

FIG. 15 is a top view showing substantially one pixel of the pixel portion. A-A' section shown in the drawing corresponds to the sectional view of the pixel portion shown in FIG. 9B. According to the pixel TFT 204, the gate electrode 224 intersects with the island-like-semiconductor layer 108 below a gate insulating film, not illustrated, via the gate insulating film and serves as a gate wiring by being extended to ride over a plurality of insulating semiconductor layers. Although not illustrated, the island-like semiconductor layer is formed with the source region, the drain region and the LDD region explained in reference to FIG. 9B. Further, numeral 230 designates a contact portion of the source wiring 164 and the source region 215a and numeral 231 designates a contact portion of the pixel electrode 169 and the drain region 217. The storage capacitor 205 is formed by a region in which the semiconductor layer extended from the drain region 217 of the pixel TFT 204 and the capacitor wiring 225 overlap via the gate insulating film. According to the constitution, at the semiconductor layer 218, there is not an impurity element with an object of controlling valence electron.

The above-described constitution can optimize the structure of TFT constituting the respective circuit in accordance with the specification requested by the pixel TFT and the drive circuit and promote operational function and reliability of the semiconductor apparatus. Further, by forming the gate electrode by a conductive material having heat resistance, activation of the LDD region, the source region and the drain region is facilitated. Further, in forming the LDD region overlapping the gate electrode via the gate insulating film, by forming the LDD region by providing a concentration gradient in the impurity element added for the purpose of controlling the conductive type, promotion of an effect of alleviating the electric field at the vicinity of the drain region can particularly be expected.

Figure 13A:
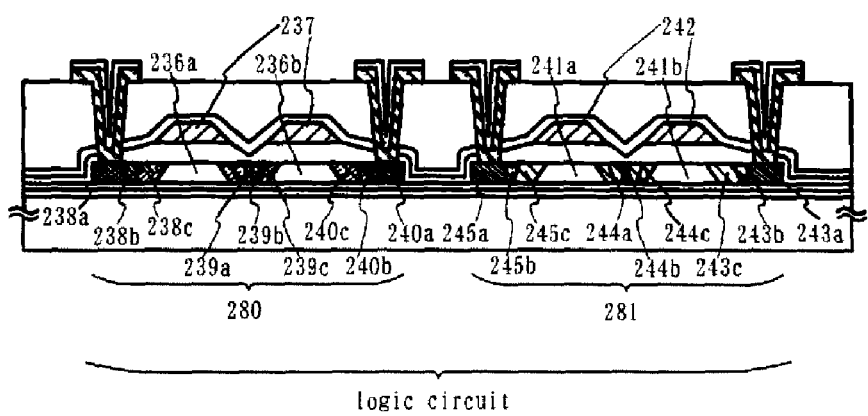
FIGS. 13A and 13B are top views showing structures of TFT of a drive circuit and pixel TFT.

In the case of the active matrix type liquid crystal display apparatus, the first p-channel type TFT 200 and the first n-channel type TFT 201 are used in a shift register circuit, a buffer circuit or a level shifter circuit attaching importance to high speed operation. In FIG. 9B, these circuits are represented as a logic circuit portion. The second impurity region (B) 209c of the first n-channel type TFT 201 is constructed by a structure attaching importance to a measure of hot carriers. Further, in order to promote withstand voltage and stabilize operation, as shown by FIG. 13A, TFTs of the logic circuit portion may be formed by a first p-channel type TFT 280 and a first n-channel type TFT 281. The TFT is constituted by a double gate structure providing two gate electrodes between a pair of a source and a drain and the TFT can be similarly fabricated by using the steps of the embodiment. According to the first p-channel type TFT 280, at an island-like semiconductor layer, there is constructed a structure having channel forming regions 236a and 236b, third impurity regions 238a, 239a and 240a functioning as source regions or drain regions, fourth impurity regions (A) 238b, 239b and 240b constituting LDD regions and fourth impurity regions (B) 238c, 239c and 240c constituting LDD regions portions of which overlap gate electrodes 237. According to the first n-channel type TFT281, at an island-like semiconductor layer, there are provided channel forming regions 241a and 241b, first impurity regions 243a, 244a and 245a functioning as source regions or drain regions and second impurity regions (A) 243b, 244b and 245b constituting LDD regions and second impurity regions (B) 243c, 244c and 245c constituting LDD regions portions of which overlap gate electrodes 242. The channel length is set to 3 µm through 7 µm and a length in a channel length direction of the LDD region overlapping the gate electrode is se to 0.1 µm through 0.3 µm.

Figure 13B:
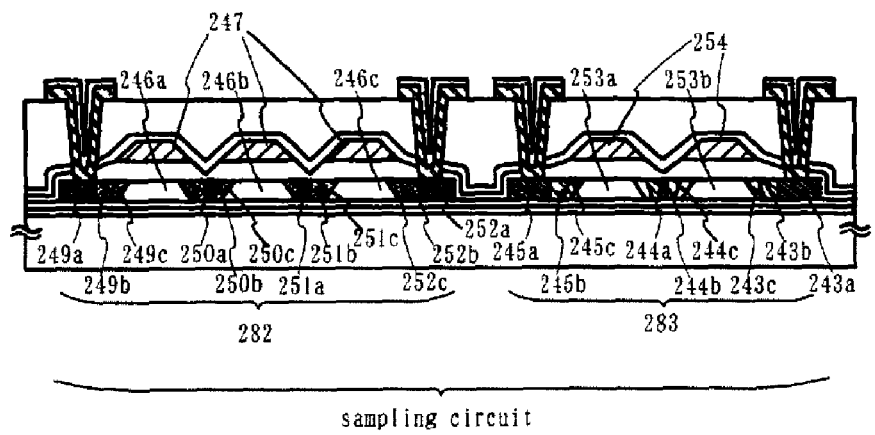

Further, the sampling circuit constituted by the analog switch can be applied with a second p-channel type TFT 282 and a second n-channel type TFT 283. According to the sampling circuit, importance is attached to the measure of hot carriers and low off current operation and accordingly, as shown by FIG. 13B, TFTs of the circuit may be formed by the second p-channel type TFT 282 and the second n-channel type TFT 283. The second p-channel type TFT 282 is constructed by a triple gate structure provided with three gate electrodes between a pair of a source and a drain and the TFT can be similarly fabricated by using the steps of the embodiment. According to the second p-channel type TFT 282, at an island-like semiconductor layer, there is constructed a structure having channel forming regions 246a, 246b and 246c, third impurity regions 249a, 250a, 251a and 252a functioning as source regions or drain regions, fourth impurity regions (A) 249a, 250b, 251b and 252b constituting LDD regions and fourth impurity regions (B) 249c, 250c, 251c and 252c constituting LDD regions portions of which overlap gate electrodes 247. According to the second n-channel type TFT 283, at an island-like semiconductor layer, there are provided channel forming regions 253a and 253b, first impurity regions 245a, 244a and 243a functioning as source regions or drain regions, second impurity regions (A) 245b, 244b and 243b and second impurity regions (B) 245c, 244c and 243c constituting LDD regions portions of which overlap gate electrodes 254. The channel length is set to 3 µm through 7 µm and a length in the channel length direction of the LDD region overlapping the gate electrode is set to 0.1 µm through 0.3 µm.

Whether the constitution of the gate electrode of TFT is constructed by a single gate structure or a multiple gate structure provided with a plurality of gate electrodes between a pair of a source and a drain, may pertinently be selected by a person executing the embodiment in accordance with a characteristic of a circuit. Further, by using the active matrix substrate finished in the embodiment, a liquid crystal apparatus of a reflection type can be fabricated.

Embodiment 7

In Embodiment 6, there is shown an example of using a heat-resistant conductive material such as W or Ta as the material of gate electrode. The reason of using such a material resides in that it is necessary to activate an impurity element added to a semiconductor layer by thermal annealing at 400° C. through 700° C. with an object of controlling a conductive type after forming a gate electrode and it is necessary to provide heat resistance to the gate electrode in carrying out the step. However, such a heat-resistant conductive material is provided with area resistance of about 10Ω and is not necessarily suitable for a display apparatus having a screen size of 4-inch class or higher. When a gate line for connecting the gate electrode is formed by the same material, a wiring length above a substrate becomes necessarily large and a problem of wiring delay by influence of wiring resistance cannot be disregarded.

For example, in the case of a pixel density of VGA, there are formed 480 of gate wirings and 640 of source wirings and in the case of a pixel density of XGA, there are formed 768 of gate wirings and 1024 of source wirings. According to the screen size of a display region, in the case of 13 inch class, a length of a diagonal line is 340 mm and in the case of 18 inch class, the length is 460 mm. According to the embodiment, an explanation will be given of a method of forming a gate wiring by a low resistance conductive material such as Al or copper (Cu) as means for realizing such a liquid crystal display apparatus in reference to FIGS. 10A, 10B and 10C.

First, there are carried out steps shown by FIG. 7A through FIG. 8C similar to Embodiment 6. Further, there is carried out a step of activating an impurity element added to the respective island-like semiconductor layer with an object of controlling a conductive type. The step is carried out by thermal annealing using a furnace annealing furnace. Otherwise, a laser annealing process, or a rapid thermal annealing process (RTA process) is applicable. The thermal annealing process is carried out at 400° C. through 700° C., representatively, 500° C. through 600° C. in a nitrogen atmosphere having an oxygen concentration equal to or smaller than 1 ppm, preferably, equal to or smaller than 0.1 ppm and according to the embodiment, there is carried out a heat treatment at 500° C. for 4 hours.

In the heat treatment, the conductive layers 140 through 145 having the second taper shape are formed with conductive layers (C) 172a through 172f by a thickness of 5 nm through 80 nm from surfaces thereof. For example, when the conductive layer having the second shape is constituted by W, tungsten nitride is formed and in the case of Ta, tantalum nitride is formed. Further, there is carried out a step of hydrogenating the island-like semiconductor layer by carrying out heat treatment at 300° C. through 450° C. for 1 through 12 hours in an atmosphere including 3% through 100% of hydrogen. This step is a step for terminating dangling bonds of the semiconductor layer by thermally excited hydrogen. As other means of hydrogenation, there may be carried out plasma hydrogenation (using hydrogen excited by plasma) (FIG. 10A).

After the activating and hydrogenating processings, a gate line is formed by a low resistance conductive material. The low resistance conductive material is constituted by Al or Cu as a major component thereof and a gate line is formed from a low resistant conductive layer formed by such a material. For example, there is formed an Al film including 0.1 weight % through 2 weight % of Ti as a low resistance conductive layer over an entire face thereof (not illustrated). The low resistance conductive layer is formed by a thickness of 200 nm through 400 nm (preferably, 250 nm through 350 nm). Further, a predetermined resist pattern is formed which is subjected to an etching processing to thereby form gate lines 173 and 174. At this occasion, there is also formed a capacity line 175 connected to a storage capacitor provided at the pixel portion by the same material. When the low resistance conductive layer is a material whose major component is Al, in the etching processing, the gate line can be formed by wet etching by a phosphoric acid species etching solution while maintaining selective fabrication performance with the matrix. A first interlayer insulating film 176 is formed similar to Embodiment 6 (FIG. 10B).

Figure 11A:
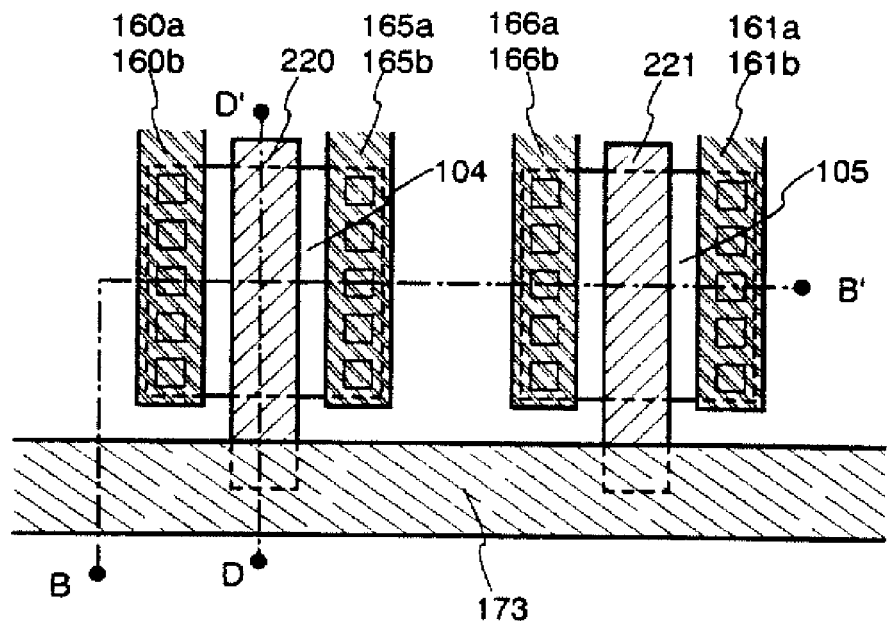
FIGS. 11A and 11B are sectional views showing structures of TFT of a drive circuit and pixel TFT.
Figure 11B:
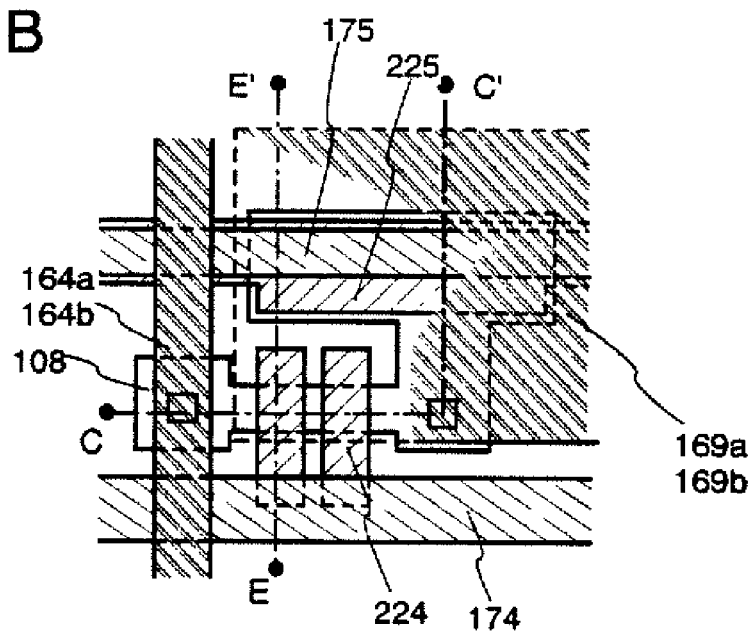
Figure 12A:
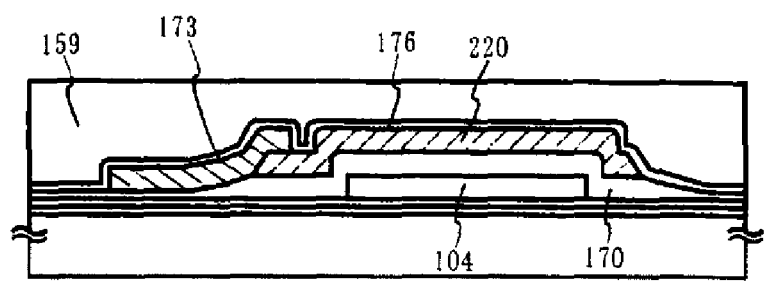
FIGS. 12A and 12B are sectional views showing a constitution of TFT of a drive circuit.
Figure 12B:
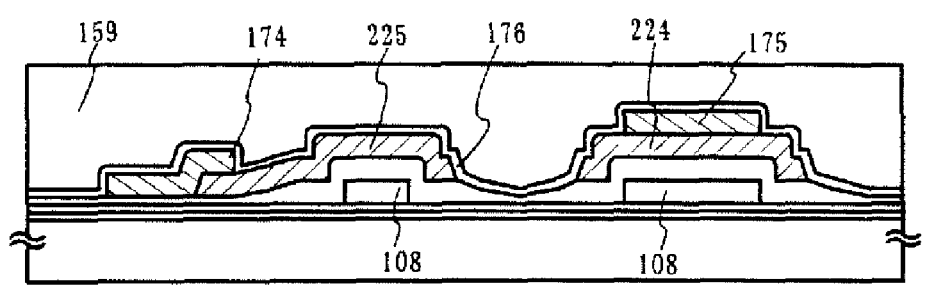

Thereafter, similar to Embodiment 6, there are formed a second interlayer insulating film 159 comprising an organic insulating material, source lines 160 through 164, drain lines 165 through 168, pixel electrodes 169 and 171, thereby, an active matrix substrate can be finished. FIGS. 11A and 11B show top views of this state and B-B' section of FIGS. 11A and C-C' section of FIG. 11B correspond to B-B' and C-C' of FIG. 9C. Although in FIGS. 11A and 11B, a gate insulating film, the first interlayer insulating film and the second interlayer insulating film are omitted, source and drain regions, not illustrated, of the island-like semiconductor layers 104, 105 and 108, the source lines 160, 161 and 164 and the drain lines 165, 166 and the pixel electrodes 169 are connected via contact holes. Further, D-D' section of FIGS. 11A and E-E' section of FIG. 11B are respectively shown in FIGS. 12A and 12B. There are formed the gate line 173 and the gate line 174 to respectively overlap the gate electrode 220 and the gate electrode 225 on outer sides of the island-like semiconductor layers 104 and 108 and the gate electrodes and the low resistant conductive layers are brought into contact with each other and electrically conducted to each other without interposing contact holes. By forming the gate line by the low resistance conductive material in this way, the wiring resistance can sufficiently be reduced. Therefore, the embodiment is applicable to a display apparatus having a pixel portion (screen size) of 4 inch class or higher.

Embodiment 8

The active matrix substrate fabricated in Embodiment 6 is applicable to a reflection type display apparatus as it is. Meanwhile, in the case of constituting a transmission type liquid crystal display apparatus, pixel electrodes provided at respective pixels of a pixel portion may be formed by transparent electrodes. According to the embodiment, an explanation will be given of a method of fabricating an active matrix substrate in correspondence with a transmission type liquid crystal display apparatus in reference to FIGS. 14A, 14B, 14C and 14D.

Figure 14A:
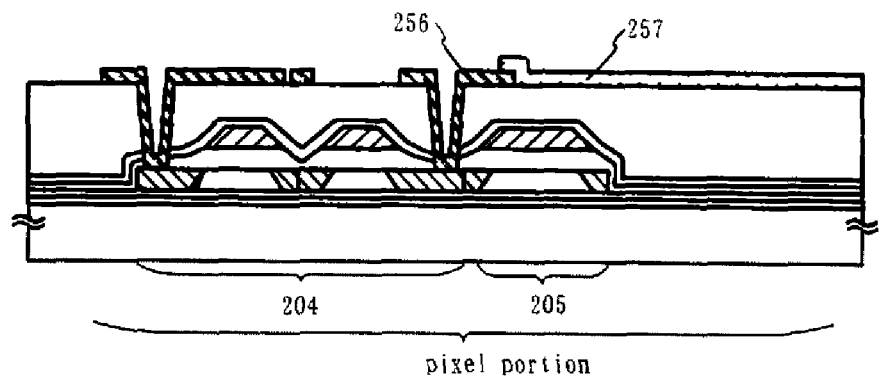
FIGS. 14A, 14B, 14C and 14D are sectional views showing a constitution of pixel TFT.
Figure 14B:
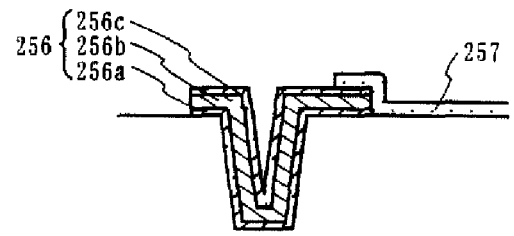

The active matrix substrate is fabricated similar to Embodiment 6. In FIG. 14A, a source wiring and a drain wiring are formed by conductive metal films by a sputtering process or a vacuum deposition process. Explaining in details a constitution of a drain line 256 as an example in reference to FIG. 14B, a Ti film 256a is formed by a thickness of 50 nm through 150 nm to thereby form a semiconductor film for forming a source or a drain region of the island-like semiconductor layer and a contact. An Al film 256b is formed by a thickness of 300 nm through 400 nm to overlap the Ti film 256a, further, a Ti film 256c or a titanium nitride (TiN) film is formed by a thickness of 100 nm through 200 nm to thereby constitute a three layers structure. Thereafter, a transparent conductive film is formed over an entire face thereof and a pixel electrode 257 is formed by a patterning processing using a photomask and an etching processing. The pixel electrode 257 is formed over the second interlayer insulating film comprising an organic resin material and is provided with a portion thereof overlapping the drain line 256 of the pixel TFT 204 to thereby constitute electric connection therebetween.

Figure 14C:
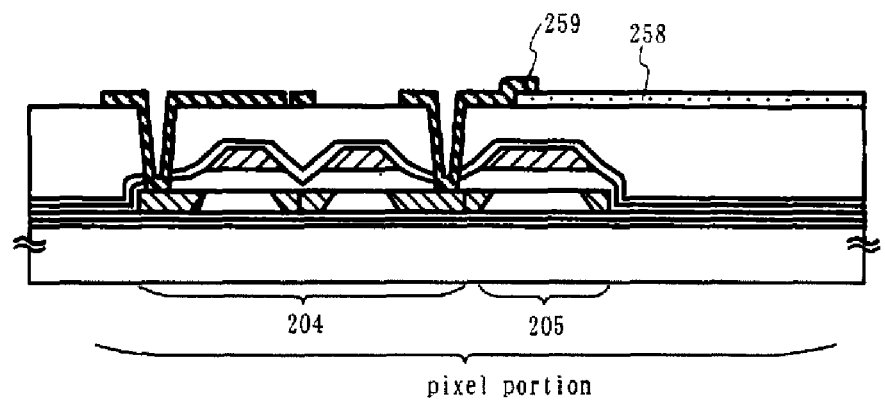
Figure 14D:
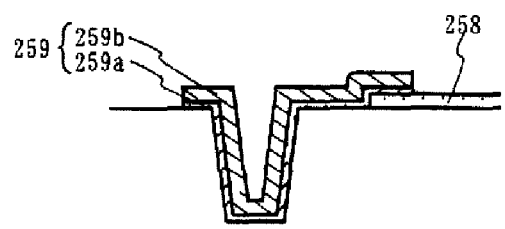

FIG. 14C shows an example of forming initially a transparent conductive film over the second interlayer insulating film, forming a pixel electrode 258 by carrying out a patterning processing and an etching processing and thereafter forming a drain line 259 to thereby constitute a connecting portion with the pixel electrode 258 without interposing a contact hole. As shown by FIG. 14D, a drain line 259 is provided by forming a Ti film 259a by a thickness of 50 nm through 150 nm, forming a semiconductor film for constituting a source or a drain region of the island-like semiconductor layer and a contact and forming an aluminum film 259b by a thickness of 300 nm through 400 nm to overlap the Ti film 259a. According to the constitution, the pixel electrode 258 is brought into contact with only the Ti film 259a constituting the drain wiring 259. As a result, a material of the transparent conductive film and Al can firmly be prevented from being brought into direct contact with each other and reacting with each other.

The material of the transparent conductive film can use indium oxide ($In_2O_3$) or an alloy of indium oxide and tin oxide ($In_2O_3$—$SnO_2$; ITO) by forming the material by a sputtering process or a vacuum deposition process. An etching processing of such a material is carried out by a hydrochloric acid species solution. However, particularly in etching of ITO, residue is liable to produce and accordingly, in order to improve etching performance, an alloy of indium oxide and zinc oxide ($In_2O_3$—$ZnO$) may be used. The alloy of indium oxide and zinc oxide is excellent in smoothness of surface and excellent in thermal stability in comparison with the ITO and accordingly, in the constitution of FIGS. 14A and 14B, at an end face of the drain wiring 256, it can be prevented that the Al film 256b is brought into contact with the pixel electrode 257 to thereby cause corrosion reaction. Similarly, zinc oxide (ZnO) is also a suitable material and in order to promote transmittance of visible light and conductivity, zinc oxide added with gallium (Ga) (ZnO:Ga) can be used.

Although in Embodiment 6, the active matrix substrate capable of fabricating a reflection type liquid crystal display apparatus is fabricated by five sheets of the photomasks, by adding further one sheet of photomask (total 6 sheets), an active matrix substrate in correspondence with a transmission type liquid crystal display apparatus can be finished. Although according to the embodiment, an explanation has been given by steps similar to those in Embodiment 6, such a constitution is applicable to the active matrix substrate shown in Embodiment 7.

Embodiment 9

According to the embodiment, an explanation will be given of steps of fabricating an active matrix type liquid crystal display apparatus from the active matrix substrate fabricated in Embodiment 6. First, as shown by FIG. 16A, there are formed spacers comprising columnar spacers to the active matrix substrate in the state of FIG. 9B. Although the spacers may be constituted by a method of providing thereof by scattering particles of several μm, in this case, there is adopted a method of forming a resin film over an entire face of the substrate and thereafter patterning the resin film. Although such a material of a spacer is not limited, for example, there is used NN700 made by JSR Co. Ltd., which is coated by a spinner and is formed into a predetermined pattern by exposure and development processings. Further, the material is set to cure at 150° C. through 200° C. by clean oven. Although the shape of the spacer fabricated in this way can be made to differ by conditions of exposure and development processings, preferably, in the case in which the shape of the spacer is constituted by a columnar shape having a flat top portion, when a substrate on an opposed side is aligned thereto, mechanical strength as a liquid crystal display panel can be ensured. Although the shape is not particularly limited such as a shape of a cone or a pyramid, when the shape is a shape of a cone, specifically, the height is set to 1.2 μm through 5 μm, the mean radius is set to 5 μm through 7 μm and a ratio of the mean radius to a radius of the base is set to 1:1.5. In this case, taper angle of a side face is made to be equal to or smaller than ±15°.

Although arrangement of spacers may arbitrarily be determined, preferably, as shown by FIG. 16A, at the pixel portion, a columnar spacer 406 may be formed to overlap the contact portion 231 of the pixel electrode 169 to cover thereof. At the contact portion 231, the flatness is deteriorated and liquid crystal is not aligned excellently at the portion and therefore, disinclination can be prevented by forming the columnar spacer 406 in the form of filling resin for spacer into the contact portion 231 in this way. Further, spacers 405a through 405e are formed also above TFTs of the drive circuit. The spacers may be formed over an entire face of the drive circuit portion or may be provided to cover source lines and drain lines as shown by FIGS. 16A and 16B.

Thereafter, an alignment film 407 is formed. Normally, polyimide resin is used for an alignment film of a liquid crystal display element. After forming the alignment film, a rubbing processing is carried out to thereby align liquid crystal molecules to be provided with a constant pretilt angle. A region which is not rubbed is set to be equal to or smaller than 2 μm in a rubbing direction from an end portion of the columnar spacer 406 provided at the pixel portion. Further, although in the rubbing processing, generation of static electricity frequently poses a problem, there can be achieved an effect of protecting TFTs against static electricity by the spacers 405a through 405e formed above TFTs of the drive circuit. Further, although not explained in the drawing, there may be constructed a constitution in which the alignment film 407 is firstly formed and thereafter, the spacers 406 and 405a through 405e are formed.

There are formed a light shielding film 402, a transparent conductive film 403 and an alignment film 404 at an opposed substrate 401 on the opposed side. Further, the active matrix substrate formed with the pixel portion and the drive circuit and the opposed substrate are pasted together by a seal member 408. The seal member 408 is mixed with a filler (not illustrated), two sheets of the substrates are pasted together with a uniform interval therebetween to the filler and the spacers 406 and 405a through 405e. Thereafter, a liquid crystal material 409 is injected between the two substrates. A known liquid crystal material may be used for the liquid crystal material. For example, other than twisted nematic liquid crystal, there can be used thresholdless antiferroelectric mixed liquid crystal showing an electro-optic response in which the transmittance is continuously changed with respect to an electric field. There is a thresholdless antiferroelectric mixed liquid crystal showing an electro-optic response of a V-like type. In this way, the active matrix type liquid crystal display apparatus shown by FIG. 16B is finished.

Figure 17:
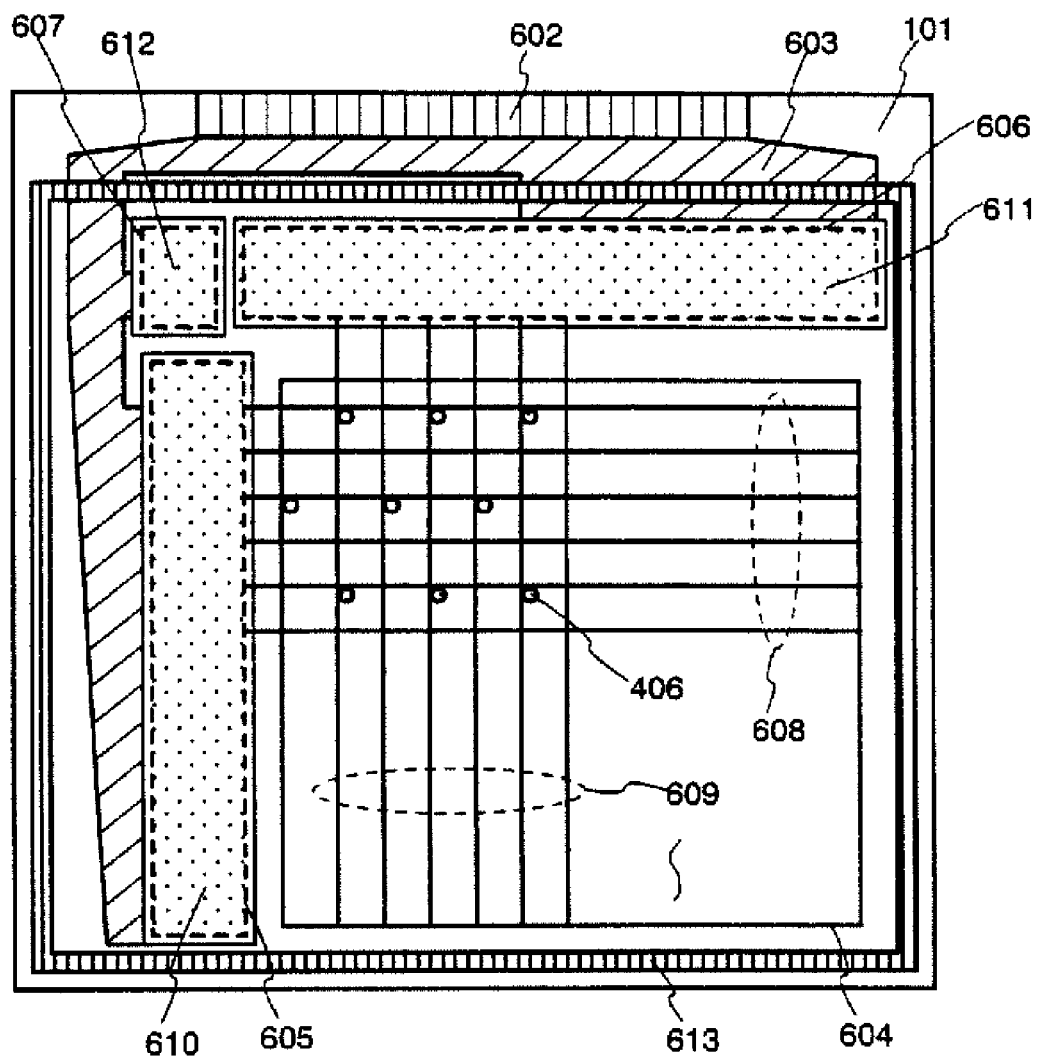
FIG. 17 is a top view for explaining an input and an output terminal, wirings, circuit arrangement and arrangement of spacers and a seal member of a liquid crystal display apparatus.

FIG. 17 shows a top view of such an active matrix substrate and is a top view showing a positional relationship among the pixel portion and the drive circuit portion, the spacers and the seal member. Above the glass substrate 101 described in Embodiment 6, there are provided a scanning signal drive circuit 605 and an image signal drive circuit 606 at a periphery of a pixel portion 604. Further, other than these, there may be added a signal processing circuit 607 such as CPU or a memory. Further, these drive circuits are connected to outside input and output terminals 602 by a connection wiring 603. At the pixel portion 604, a gate wiring group 608 extended from the scanning signal drive circuit 605 and a source wiring group 609 extended from the pixel signal drive circuit 606, are intersected with each other in a matrix to thereby form pixels and the respective pixel is provided with the pixel TFT 204 and the storage capacitor 205.

Although the columnar spacers 406 provided at the pixel portion of FIG. 16 may be provided for all of the pixels, as shown by FIG. 17, the spacers may be provided at every several pieces or several tens pieces of the pixels arranged in the matrix. That is, a rate of a number of the spacers to a total number of the pixels constituting the pixel portion can be made to be 20% through 100%. Further, the spacers 405a through 405e provided at the drive circuit portion may be provided to cover an entire face thereof or may be provided in conformity with positions of the source and drain wirings at the respective TFTs. In FIG. 17, arrangement of the spacers provided at the drive circuit portion are designated by numerals 610 through 612. Further, a seal member 619 shown in FIG. 17 is formed on outer sides of the pixel portion 604 and the scanning signal drive circuit 605, the image signal drive circuit 606 and other signal processing circuit 607 and on an inner side of the outside input and output terminals 602.

Figure 18:
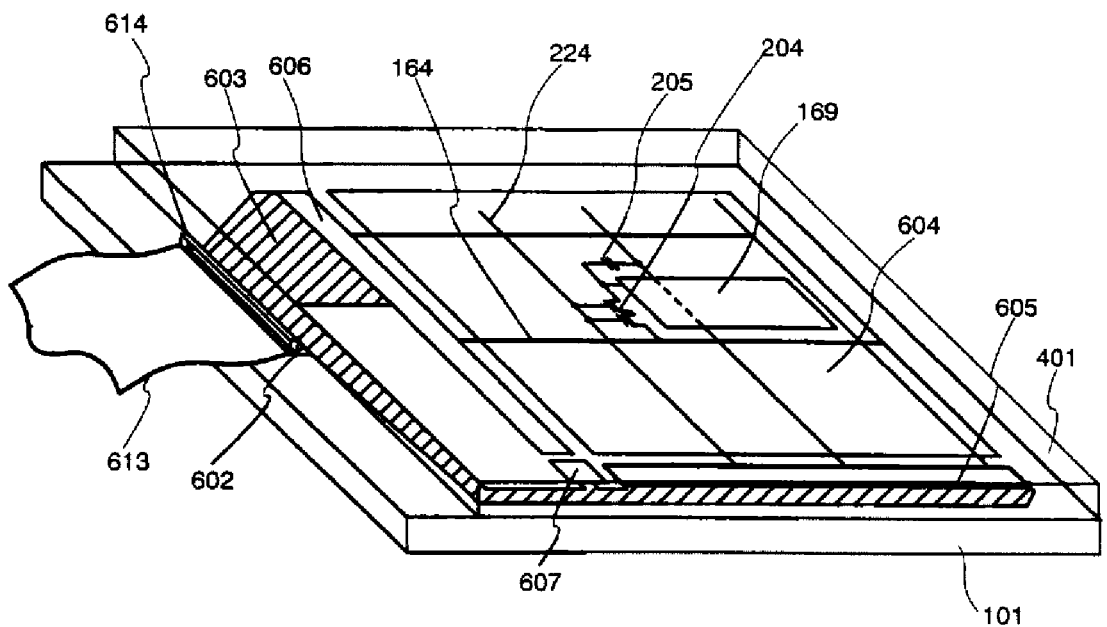
FIG. 18 is a perspective view showing a structure of a liquid crystal display apparatus.

An explanation will be given of the constitution of the active matrix type liquid crystal apparatus in reference to a perspective view of FIG. 18. In FIG. 18, the active matrix substrate is constituted by the pixel portion 604, the scanning signal drive circuit 605, the image signal drive circuit 606 and other signal processing circuit 607 which are formed above the glass substrate 101. The pixel portion 604 is provided with the pixel TFTs 204 and the storage capacitors 205 and the drive circuit provided at the periphery of the pixel portion is constituted with a CMOS circuit as a basis thereof. From the scanning signal drive circuit 605 and the image signal drive circuit 606, there are respectively extended gate lines (corresponding to numeral 224 of FIG. 9B when the gate line is formed continuous to the gate electrode) and the source lines 164 to the pixel portion 604 and connected to the pixel TFTs 204. Further, a flexible printed circuit (FPC) board 613 is connected to the external input terminals 602 for inputting image signals and the like. The FPC board 613 is solidly adhered thereto by reinforced resin 614. Further, the FPC board 613 is connected to the respective drive circuits by the connection wiring 603. Further, there are provided a light shielding film and a transparent electrode, not illustrated, at the opposed substrate 401.

The liquid crystal display apparatus having such a constitution can be formed by using the active matrix substrates shown in Embodiments 6 through 8. When the active matrix substrate shown in Embodiment 6 is used, the reflection type liquid crystal display apparatus can be provided and when the active matrix substrate shown in Embodiment 8 is used, the transmission type liquid crystal display apparatus can be provided.

Embodiment 10

Figure 19:
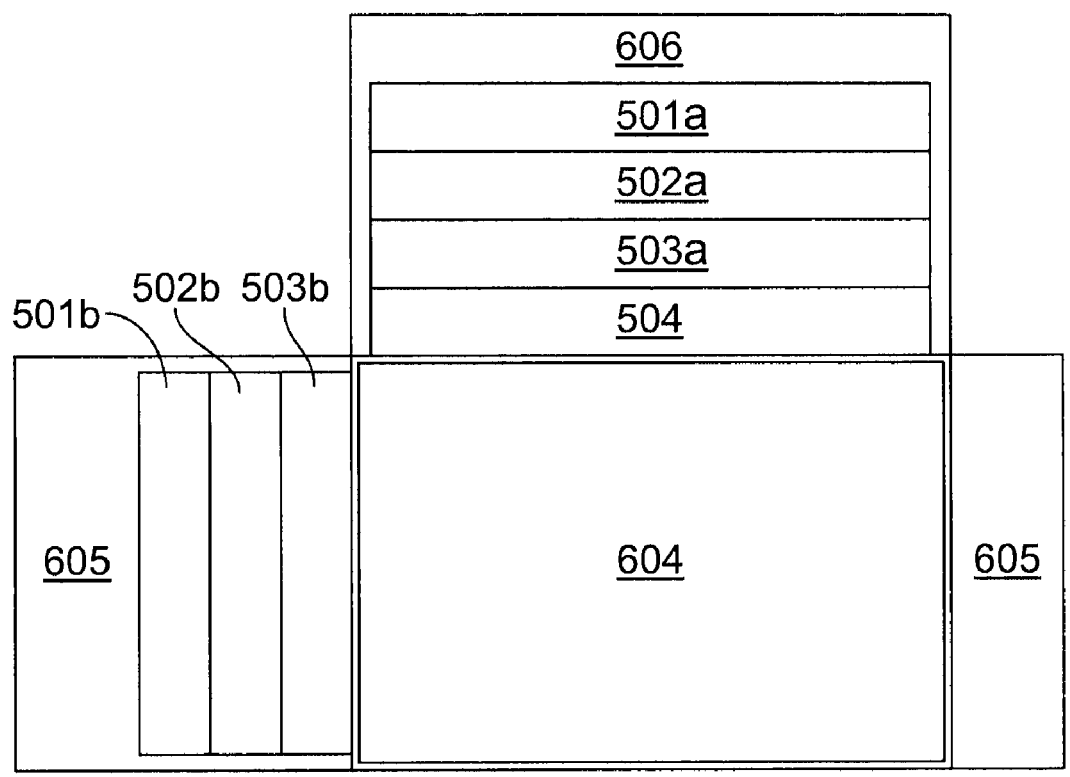
FIG. 19 is a block diagram for explaining a circuit constitution of an active matrix type display apparatus.

FIG. 19 is a view showing an example of a circuit constitution of the active matrix substrate described in Embodiments 6 through 8 and showing a circuit constitution of a display apparatus of a direct viewing type. The active matrix substrate is provided with the image signal drive circuit 606, the scanning signal drive circuits (A) and (B) 605 and the pixel portion 604. Further, a drive circuit described in the specification is a general designation including the image signal drive circuit 606 and the scanning signal drive circuit 605.

The image signal drive circuit 606 is provided with a shift register circuit 501a, a level shifter circuit 502a, a buffer circuit 503a and a sampling circuit 504. Further, the scanning signal drive circuit (A) or (B) 605 is provided with a shift register circuit 501b, a level shifter circuit 502b and a buffer circuit 503b.

According to the shift register circuits 501a and 501b, drive voltage is 5 V through 16 V (representatively, 10 V) and TFT of a CMOS circuit forming the circuit is formed by the first p-channel type TFT 200 or the first n-channel type TFT 201 of FIG. 9B. Or, TFT may be formed by the first p-channel type TFT 280 or the first n-channel type TFT 281 shown in FIG. 13A. Further, since according to the level shifter circuits 502a and 502b or the buffer circuits 503a and 503b, drive voltage becomes as high as 14 V through 16 V, it is preferable to construct the TFT structure of the multiple gates as shown by FIG. 13A. When TFT is formed by the multiple gate structure, withstand voltage is increased, which is effective in promoting reliability of the circuit.

The sampling circuit 504 is constituted by an analog switch, drive voltage is 14 V through 16 V and the circuit is driven by alternately reverting polarities, it is necessary to reduce the off current value and accordingly, it is preferable to form the second p-channel type TFT 202 and the second n-channel type TFT 203 shown in FIG. 9B. Or, in order to effectively reduce the off current value, the sampling circuit 504 may be formed by the second p-channel type TFT 282 and the second n-channel type TFT 283 shown in FIG. 13B.

Further, the pixel portion is provided with drive voltage of 14 V through 16 V, it is requested to reduce the off current value more than that of the sampling circuit in view of low power consumption and the multiple gate structure constitutes a basis thereof as in the pixel TFT 204 shown in FIG. 9B.

Further, the constitution of the embodiment can easily be realized by fabricating TFT in accordance with steps shown in Embodiments 6 through 8. Although according to the embodiment, only constitutions of the pixel portion and the drive circuit are shown, in accordance with the steps in Embodiments 6 through 8, other than these, a signal processing circuit such as a signal dividing circuit, a frequency dividing circuit, a D/A converter, a g correction circuit, an operational amplifier circuit, a memory circuit or an operational processing circuit, or a logic circuit can be formed above the same substrate. In this way, according to the invention, there can be realized a semiconductor apparatus including a pixel portion and a drive circuit thereof, for example, a liquid crystal display apparatus provided with a signal control circuit and a pixel portion on the same substrate.

Embodiment 11

According to the embodiment, an explanation will be given of an example of fabricating a display panel of a spontaneous light emitting type using an electroluminescence (EL) material (hereinafter, described as EL display apparatus) by using the active matrix substrate shown in the examples of fabricating thereof in the above-described embodiments. In the specification, an EL display apparatus generally refers to a display panel enclosed with light emitting elements formed above a substrate between the substrate and a cover member and a display module mounted with ICs at the display panel. Further, a light emitting element is provided with a layer (light emitting layer) including an organic compound providing electroluminescence produced by applying an electric field, an anode layer and a cathode layer. Further, in electroluminescence in an organic compound, there are light emittance (fluorescence) when a singlet excited state returns to a ground state and light emittance (phosphorescence) when a triplet excited state returns to the ground state and either or both of the light emittance is included.

Figure 20A:
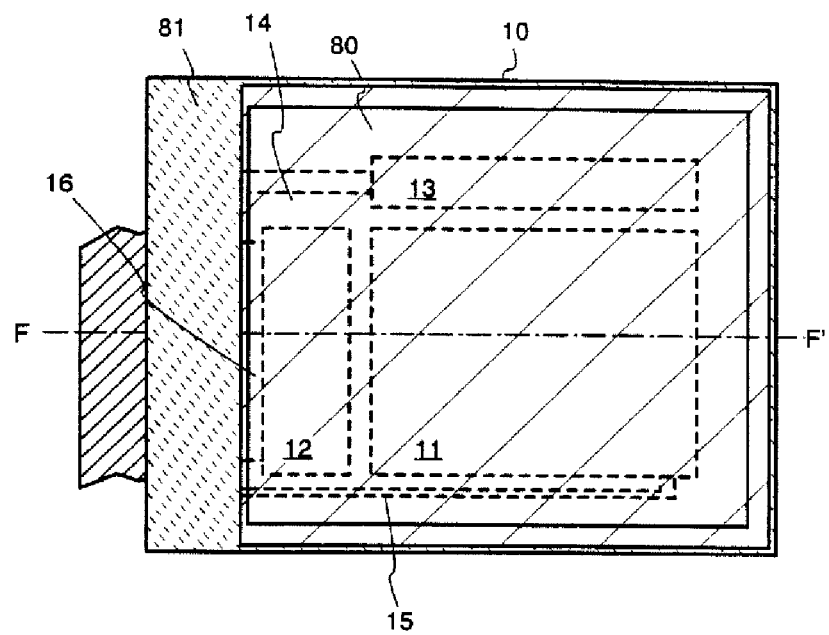
FIGS. 20A and 20B are a top view and a sectional view showing a structure of an EL display apparatus.

FIG. 20A is a top view of an EL display panel according to the invention. In FIG. 20A, numeral 10 designates a substrate, numeral 11 designates a pixel portion, numeral 12 designates a source side drive circuit and numeral 13 designates a gate side drive circuit and the respective drive circuits reach FPC 17 via wirings 14 through 16 and connected to an outside apparatus.

Figure 20B:
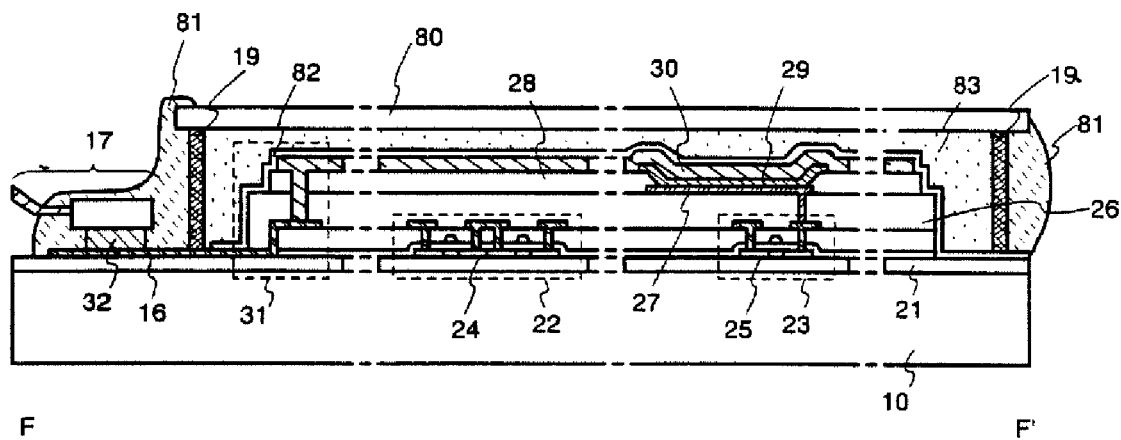

FIG. 20B is a view showing F-F' section of FIG. 20A and an opposed plate 80 is provided at least above a pixel portion, preferably above a drive circuit and a pixel portion. The opposed plate 80 is pasted together with an active matrix substrate formed with TFTs and an EL layer by a seal member 19. The seal member 19 is mixed with a filler (not illustrated) and two sheets of substrates are pasted together with a substantially uniform interval therebetween by the filler. Further, there is constructed a structure in which an outer side of the seal member 19 and an upper face and a periphery of FPC 17 are hermetically sealed by a seal agent 81. There is used a material of silicone resin, epoxy resin, phenol resin or butyl rubber for the seal agent 81.

When an active matrix substrate 10 and the opposed substrate 80 are pasted together by the seal member 19 in this way, a space is formed therebetween. A filling agent 83 is filled in the space. The filling agent 83 is also provided with an effect of adhering the opposed plate 80. The filling agent 83 can use PVC (polyvinyl chloride), epoxy resin, silicone resin, PVB (polyvinyl butyral) or EVA (ethylene vinyl acetate). Further, the EL layer is weak at humidity starting from moisture and is liable to deteriorate and accordingly, when a drying agent such as barium oxide is mixed to an inner portion of the filling agent 83, the hygroscopic effect can be maintained, which is preferable. Further, there is constructed a structure in which a passivation film 82 formed by a silicon nitride film or a silicon oxynitride film is formed on the EL layer to thereby prevent corrosion by an alkaline element included in the filling agent 83.

The opposed plate 80 can use an aluminum plate, a stainless steel plate, an FRP (fiberglass-reinforced plastics), a PVF (polyvinyl fluoride) film, a Miler film (commercial name of DuPont Co. Ltd.), a polyester film, an acrylic film or an acrylic plate. Further, the hygroscopic performance can be promoted by using a sheet having a structure in which an aluminum foil of several tens μm is sandwiched by PVF films or Miler films. In this way, the EL element is brought into a hermetically sealed state and is shielded from outside air.

Further, in FIG. 20B, above the substrate 10 and a matrix film 21, there are formed TFT for a drive circuit (incidentally, here, there is illustrated a CMOS circuit combined with an n-channel type TFT and a p-channel type TFT) 22 and TFT 23 for a pixel portion (incidentally, here, there is illustrated only TFT for controlling current to the EL element). At insides of the TFTs, particularly, n-channel type TFT, there is provided an LDD region having a constitution shown in the embodiment in order to prevent a reduction in on current caused by hot carrier effect and a deterioration in characteristic by threshold voltage shift or bias stress.

For example, there may be used the p-channel type TFT 200 and 202 and the n-channel type TFT 201 and 203 shown in FIG. 9B for TFT 22 for the drive circuit. Further, there may be used the pixel TFT 204 shown in FIG. 9B or a p-channel type TFT having a structure similar thereto for TFT 23 for the pixel portion.

In order to fabricate the EL display apparatus from the active matrix substrate in the state of FIG. 9B or FIG. 10B, an interlayer insulating film (flattening film) 26 comprising a resin material is formed above a source line and a drain line and a pixel electrode 27 comprising a transparent conductive film electrically connected to the drain of TFT 23 for the pixel portion is formed thereabove. There can be used a compound of indium oxide and tin oxide (referred to as TIO) or a compound of indium oxide and zinc oxide for the transparent conductive film. Further, when the pixel electrode 27 is formed, an insulating film 28 is formed and an opening portion is formed above the pixel electrode 27.

Next, an EL layer 29 is formed. The EL layer 29 may be constructed by a laminated structure or a single layer structure by freely combining known EL material (hole injection layer, hole transportation layer, light emitting layer, electron transportation layer or electron injection layer). Known technology may be used for constructing any of the structures. Further, there are a low molecular species material and a high molecular species (polymer species) material for the EL material. When a low molecular species material is used, a vapor deposition process is used and when a high molecular species material is used, a simple process of a spin coating process, a printing process or an ink jet process can be used.

The EL layer is formed by a vapor deposition process by using a shadow mask, an ink jet process or a dispenser process. In any of the process, by forming light emitting layers (red color light emitting layer, green color light emitting layer and blue color light emitting layer) capable of emitting light having different wavelength for respective pixel, color display is enabled. Otherwise, there are a system combined with a color conversion layer (CCM) and a color filter and a system combined with awhile color light emitting layer and a color filter and any of the processes may be used. Naturally, there can be constructed an EL display apparatus for single color light emittance.

When the EL layer 29 is formed, a cathode 30 is formed thereabove. It is preferable to exclude moisture or oxygen present at an interface between the cathode 30 and the EL layer 29 as less as possible. Therefore, there is needed a devise such that the EL layer 29 and the cathode 30 are formed continuously in vacuum or the EL layer 29 is formed in an inert atmosphere and the cathode 30 is formed in vacuum without being exposed to the atmosphere. According to the embodiment, the above-described film formation is enabled by using a film forming apparatus of a multiple chamber system (cluster tool system).

Further, according to the embodiment, there is used a laminated structure of an LiF (lithium fluoride) film and an Al (aluminum) film as the cathode 30. Specifically, there is formed an LiF (lithium fluoride) film having a thickness of 1 nm above the EL layer 29 by a vapor deposition process and an aluminum film having a thickness of 300 nm is formed thereabove. Naturally, there may be used an MgAg electrode which is a known cathode material. Further, the cathode 30 is connected to a wiring 16 in a region designated by numeral 31. The wiring 16 is a power source supply line for providing predetermined voltage to the cathode 30 and is connected to FPC 17 via an anisotropic conductive paste material 32. The resin layer 81 is further formed above FPC 17 to thereby promote adhering strength of the portion.

In order to electrically connect the cathode 30 and the wiring 16 at the region designated by numeral 31, it is necessary to form contact holes in the interlayer insulating film 26 and the insulating film 28. The contact holes may be formed in etching the interlayer insulating film 26 (forming a contact hole for pixel electrode) and in etching the insulating film 28 (in forming an opening portion before forming EL layer). Further, when the insulating film 28 is etched, also the interlayer insulating film 26 may be etched summarizingly. In that case, when the interlayer insulating film 26 and the insulating film 28 are constituted by the same resin material, shapes of the contact holes can be made excellent.

Further, the wiring 16 is electrically connected to FPC 17 by passing through a clearance between the seal member 19 and the substrate 10 (however, enclosed by the sealing agent 81). Further, in this case, although an explanation has been given of the wiring 16, the other wirings 14 and 15 are similarly connected electrically to FPC 17 by passing below the seal member 19.

Figures 21A, 21B:
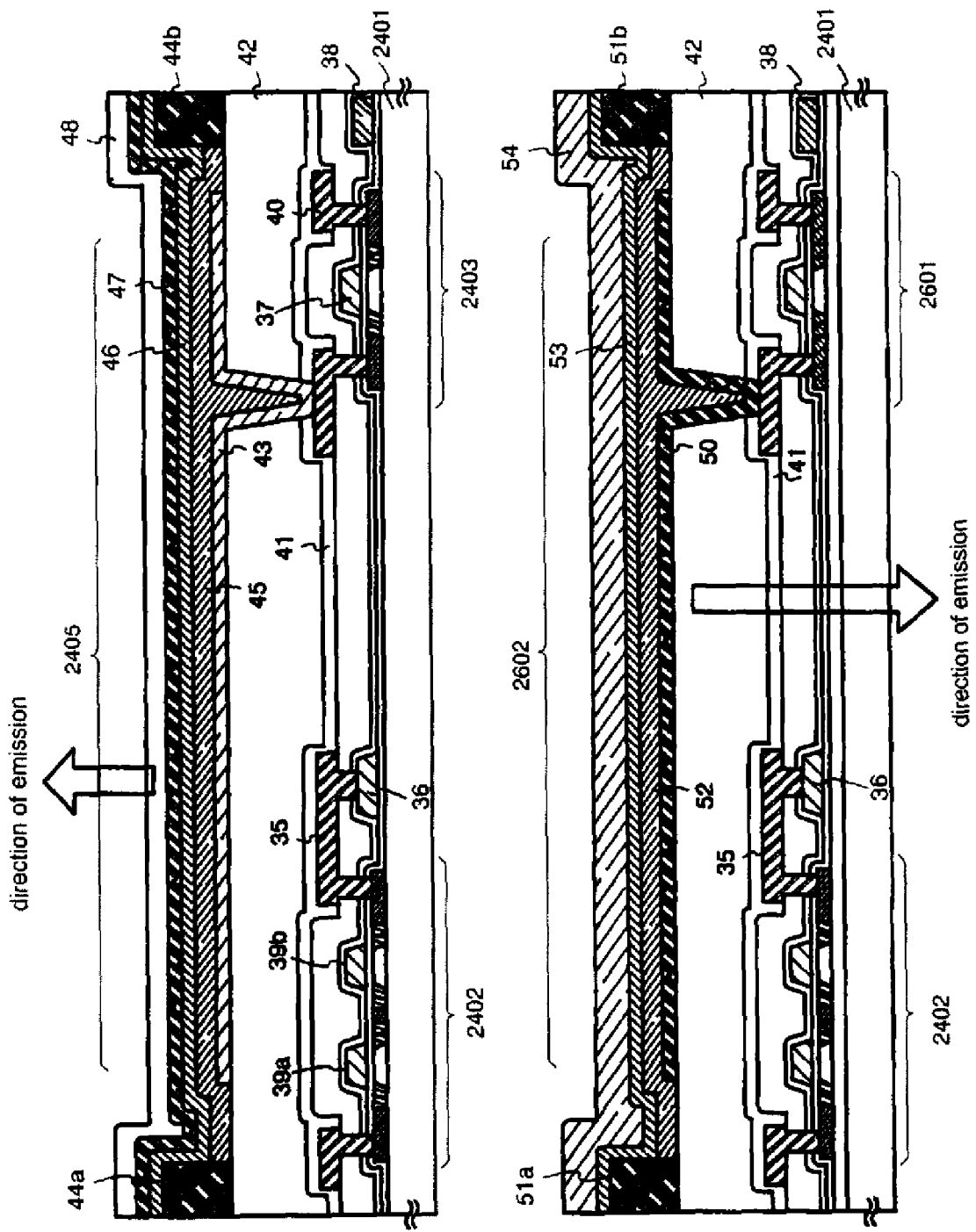
FIGS. 21A and 21B are sectional views of a pixel portion of an EL display apparatus.

Here, a description will be given of a further detailed sectional structure of the pixel portion in reference to FIGS. 21A and 21B, an upper face structure thereof in reference to FIG. 22A and a circuit diagram thereof in reference to FIG. 22B. In FIG. 21A, a switching TFT 2402 provided above a substrate 2401 is formed by a structure the same as that of the pixel TFT 204 of FIG. 9B. By constituting the double gate structure, there is constructed a structure in which substantially two TFTs are aligned in series and there is achieved an advantage of capable of reducing the off current value. Further, although according to the embodiment, the double gate structure is constructed, there may be constructed a triple gate structure or a multiple gate structure having a larger number of gates.

Further, a current controlling TFT 2403 is formed by using the n-channel type TFT 201 shown by FIG. 9B. At this occasion, a drain line 35 of the switching TFT 2402 is electrically connected to a gate electrode 37 of the current controlling TFT by a wiring 36. Further, a wiring designated by numeral 38 is a gate line for electrically connecting gate electrodes 39a and 39b of the switching TFT 2402.

In this case, it has very important significance that the current controlling TFT 2403 is constituted by the structure according to the invention. The current controlling TFT is an element for controlling an amount of current flowing in the EL element and accordingly, a large amount of current flows therein and the current controlling TFT is an element having high danger of deterioration by heat or deterioration by hot carriers. Therefore, by providing an LDD region a portion of which overlaps the gate electrode in the current controlling TFT, deterioration of TFT can be prevented and stability of operation can be promoted.

Further, although according to the embodiment, the current controlling TFT 2403 is constructed by a single gate structure as illustrated, there may be constructed a multiple gate structure in which a plurality of TFTs are connected in series. Further, there may be constructed a structure in which a plurality of TFTs are connected in series to substantially divide a channel forming region into a plurality of divisions thereof to thereby irradiate heat at a high efficiency. Such a structure is effective as a countermeasure against deterioration by heat.

Figure 22A:
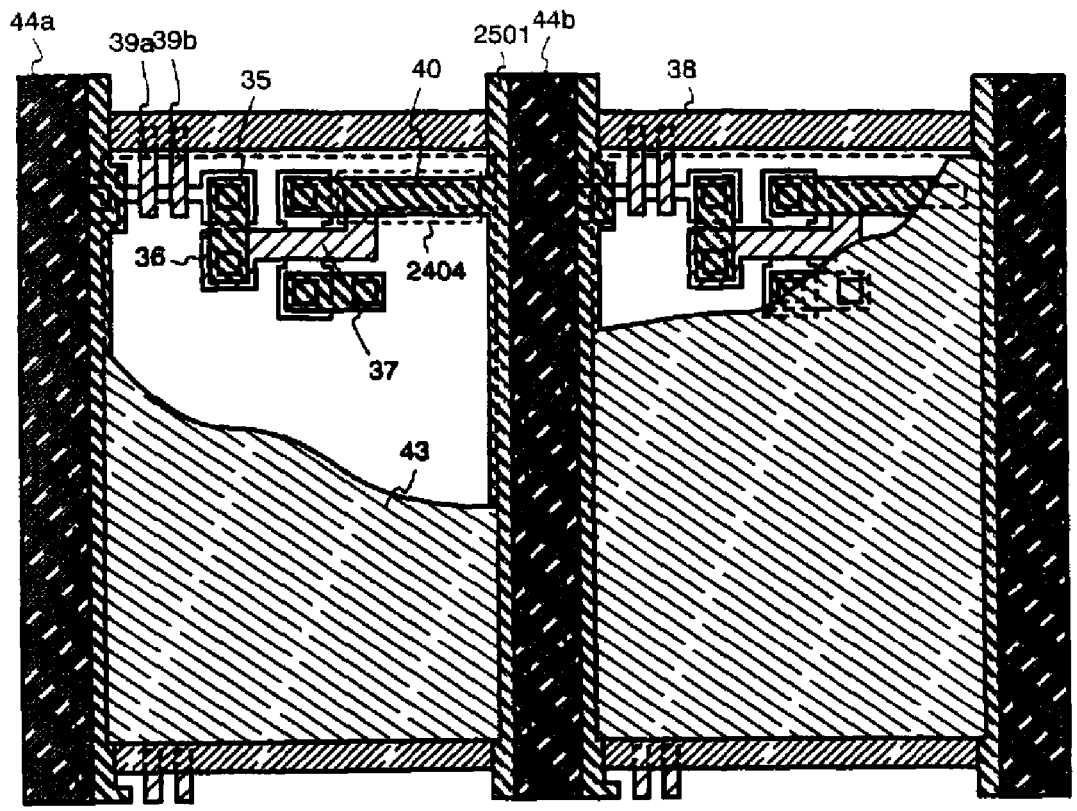
FIGS. 22A and 22B are a top view and a circuit diagram of a pixel portion of an EL display apparatus.

Further, as shown by FIG. 22A, at a region designated by numeral 2404, a wiring of the current controlling TFT 2403 constituting the gate electrode 37 overlaps the drain line 40 of the current controlling TFT 2403 via an insulating film. In this case, at the region shown by numeral 2404, a condenser is formed. The condenser 2404 functions as a condenser for holding voltage applied on the gate of the current controlling TFT 2403. Further, the drain line 40 is connected to a current supply line (power source line) 2501 and is applied always with constant voltage.

A first passivation film 41 is provided above the switching TFT 2402 and the current controlling TFT 2403 and a flattening film 42 constituted by a resin insulating film is formed thereabove. It is very important to flatten a stepped difference caused by TFT by using the flattening film 42. The EL layer formed at later step is very thin and accordingly, there is case of causing a failure in light emittance by presence of the stepped difference. Therefore, it is preferable to flatten thereof before forming the pixel electrode such that the EL layer can be formed into a face which is as flat as possible.

Further, numeral 43 designates a pixel electrode (cathode of EL element) constituted by a conductive film having high reflectance, which is electrically connected to the drain of the current controlling TFT 2403. It is preferable to use a conductive film having low resistance such as an aluminum alloy film, a copper alloy film or a silver alloy film or a laminated film of these for the pixel electrode 43. Further, there is formed a light emitting layer 44 in a groove (corresponding to pixel) formed by banks 44a and 44b, which is formed by an insulating film (preferably, resin). Further, although only one pixel is illustrated here, the light emitting layer may be fabricated to divide in correspondence with respective colors of R (red), G (green) and B (blue). As an organic EL material for constituting the light emitting layer, there is used a π-conjugated polymer species material. As a representative polymer species material, there is pointed out polyparaphenylene vinylene (PPV) species, polyvinyl carbazole (PVK), or polyfluorene species. Further, although there are various types for an organic EL material of PPV species, there may be used materials described in, for example, H. Shenk, H. Becker, O. Gelsen, E. Kluge, W. Kreuderand and H. Spreitzer, "Polymers for Light Emitting Diodes", Euro Display, Proceedings, 1999, p. 33-37 and Japanese Patent Laid-Open No. 92576/1998.

As specific light emitting layers, cyanopolyphenylene vinylene may be used for a light emitting layer for emitting red color, polyphenylene vinylene may be used for a light emitting layer for emitting green color and polyphenylene vinylene or polyalkyl phenylene may be used for a light emitting layer for emitting blue color. The film thickness may be 30 nm through 150 nm (preferably, 40 nm through 100 nm). However, the above-described examples are only examples of organic EL materials which can be used for light emitting layers and it is not necessary to limit the material thereto at all. The EL layer (layer for carrying out light emittance and movement of carriers therefor) may be formed by freely combining a light emitting layers, a charge transportation layer or a charge injection layer. For example, although according to the embodiment, there is shown an example of using a polymer species material for a light emitting layer, a low molecular EL material may be used. Further, an inorganic material such as silicon carbide can be used for a charge transportation layer or a charge injection layer. Known materials can be used for the organic EL material or the inorganic material.

According to the embodiment, there is constructed the EL layer having a laminated structure provided with a pore injection layer 46 comprising PEDOT (polyothiophene) or PAni (polyaniline) above a light emitting layer 45. Further, there is provided an anode 47 comprising a transparent conductive film above the pore injection layer 46. In the case of the embodiment, light generated by the light emitting layer 45 is irradiated toward the upper face side (toward upper side of TFT) and accordingly, the anode must be light-transmitting. Although as the transparent conductive layer, there can be used a compound of indium oxide and tin oxide or a compound of indium oxide and zinc oxide, since the transparent conductive film is formed after forming the light emitting layer and the pore injection layer having low heat resistance, the transparent conductive film is preferably constituted at temperature as low as possible.

An EL element 2405 is finished at a time point of forming the anode 47. Further, the EL element 2405, mentioned here, designates a condenser formed by the pixel electrode (cathode) 43, the light emitting layer 45, the pore injection layer 46 and the anode 47. As shown by FIG. 22A, the pixel electrode 43 substantially coincides with the pixel in area and accordingly, a total of the pixel functions as the EL element. Therefore, an efficiency of utilizing light emittance is very high and light image display is enabled.

Incidentally, according to the embodiment, a second passivation film 48 is further provided above the anode 47. The second passivation film 48 is preferably a silicon nitride film or a silicon oxynitride film. An object thereof resides in shielding the EL element from outside, which is provided with both significance of preventing a deterioration of the organic EL material by oxidation and a significance of restraining degassing from the organic EL material. Thereby, reliability of the EL display apparatus is promoted.

Figure 22B:
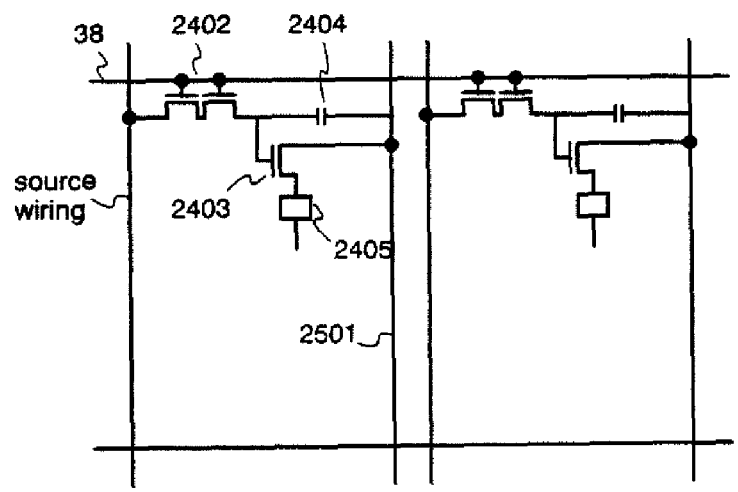

As described above, the EL display panel according to the invention is provided with the pixel portion comprising the pixel having the structure as shown by FIGS. 22A and 22B and is provided with the switching TFT having sufficiently low off current value and the current controlling TFT which is strong at hot carrier injection. Therefore, there is provided the EL display panel having high reliability and capable of displaying image excellently.

FIG. 21B shows an example of inverting the structure of the EL layer. A current controlling TFT 2601 is formed by using the p-channel type TFT 200 of FIG. 98. A reference may be given to Embodiment 7 for a process of fabricating thereof. According to the embodiment, there is used a transparent conductive film as a pixel electrode (anode) 50. Specifically, there is used a conductive film comprising a compound of indium oxide and zinc oxide. Naturally, there may be used a conductive film comprising a compound of indium oxide and tin oxide.

Further, after forming banks 51a and 51b comprising insulating films, there is formed a light emitting layer 52 comprising polyvinyl carbazole by coating a solution. An electron injection layer 53 comprising potassium acetyl acetate (designated by notation acacK) and a cathode 54 comprising an aluminum alloy are formed thereabove. In this case, the anode 54 functions also as a passivation film. In this way, an EL element 2602 is formed. In the case of the embodiment, light generated by the light emitting layer 53 is irradiated toward the substrate formed with TFTs as show by an arrow mark. In the case of the structure as shown by the embodiment, it is preferable to form the current controlling TFT 2601 by the p-channel type TFT.

Further, the constitution of the embodiment can be implemented by freely combining the constitutions of TFTs in Embodiments 6 through 8. Further, it is effective to use the EL display panel according to the embodiment as a display portion of the electronic apparatus in Embodiment 13.

Embodiment 12

Figure 23A:
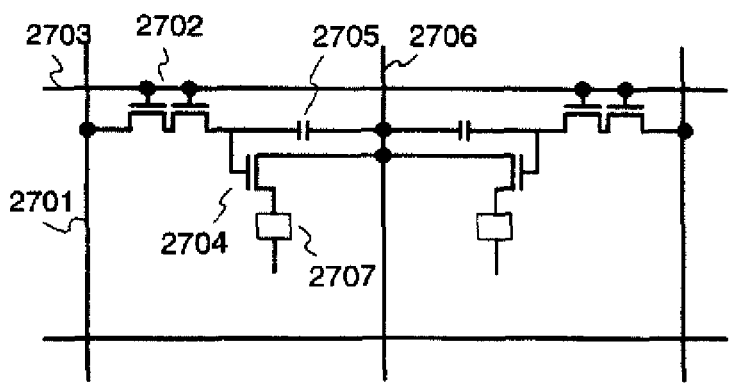
FIGS. 23A, 23B and 23C show examples of circuit diagrams of a pixel portion of an EL display apparatus.
Figure 23B:
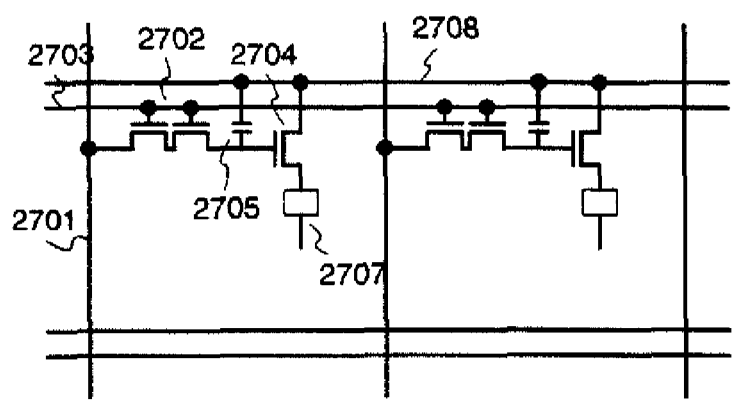
Figure 23C:
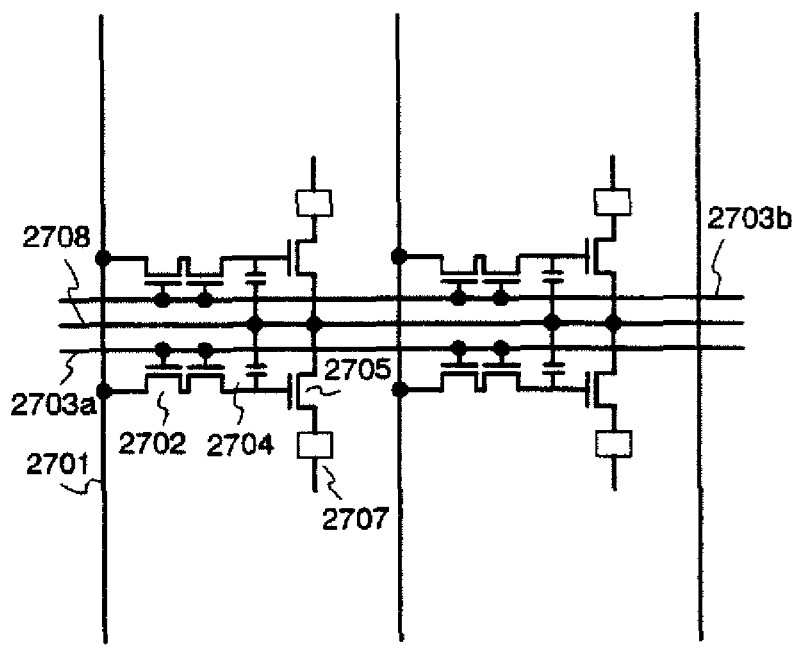

According to the embodiment, FIGS. 23A, 23B and 23C show examples of cases of constituting pixels having structures different from the circuit diagram shown by FIG. 22B. Further, in the embodiment, numeral 2701 designates a source wiring of a switching TFT 2702, numeral 2703 designates a gate wiring of the switching TFT 2702, numeral 2704 designates a current controlling TFT, numeral 2705 designates a condenser, numerals 2706 and 2708 designate current supply lines and numeral 2707 designates an EL element.

FIG. 23A shows an example of a case in which the current supply line 2706 is made common between two pixels. That is, the example is characterized in that the two pixels are formed to constitute line symmetry centering on the current supply line 2076. In this case, since a number of the power supply lines can be reduced, the pixel portion can further be made finer.

Further, FIG. 23B shows an example in the case in which the current supply line 2708 is provided in parallel with the gate wiring 2703. Further, although according to FIG. 23B, there is constructed a structure in which the current supply line 2708 and the gate wiring 2703 are provided not to overlap each other, when the both members are wirings formed at different layers, the both members can be provided to overlap via an insulating film. In this case, an exclusive area can be shared by the power supply line 2708 and the gate line 2703 and accordingly, the pixel portion can be made finer.

Further, FIG. 23C is characterized in that the current supply line 2708 is provided in parallel with the gate wirings 2703 similar to the structure of FIG. 23B, further, two pixels are formed to constitute line symmetry centering on the current supply line 2708. Further, it is also effective to provide the current supply line 2708 to overlap either one of the gate wirings 2703. In this case, since a number of the power supply lines can be reduced the pixel portion can be made finer. Although in FIG. 23A and FIG. 23B, there is constructed a structure in which the condenser 2404 is provided for maintaining voltage applied to the gate of the current controlling TFT 2403, the condenser 2404 can also be omitted.

The n-channel type TFT according to the invention shown by FIG. 21A is used as the current controlling TFT 2403 and accordingly, there is provided an LDD region provided to overlap a gate electrode via the gate insulating film. At the overlapped region, there is generally formed parasitic capacitance referred to as gate capacitance, however, the embodiment is characterize in that the parasitic capacitance is positively used in place of the condenser 2404. The capacitance of the parasitic capacitance is changed by an area of overlapping the gate electrode and the LDD region and accordingly, the capacitance is determined by a length of the LDD region included in the overlapped region. Further, the condenser 2705 can be omitted similarly also in the structures of FIGS. 23A, 23B and 23C.

Further, the constitution of the embodiment can be implemented by being freely combined with the constitutions of TFTs of Embodiments 6 through 8. Further, it is effective to use the EL display panel of the embodiment as display portions of an electronic apparatus according to Embodiment 13.

Embodiment 13

The CMOS circuit and the pixel portion formed by implementing the invention can be used in various electro-optic apparatus (active matrix type liquid crystal display, active matrix type EC display). That is, the present invention can be implemented in all of electronic apparatus integrated with the electro-optic apparatus at display portions thereof.

As such electronic apparatus, there are pointed out a video camera, a digital camera, a projector (rear type or front type), a head mount display (goggle type display), a car navigation system, a car stereo, a personal computer, a portable information terminal (mobile computer, portable telephone or electronic book) and the like. Examples of these are shown in FIGS. 24A, 24B, 24C, 24D, 24E and 24F, FIGS. 25A, 25B, 25C and 25D and FIGS. 26A, 2613 and 26C.

FIG. 24A shows a personal computer including a main body 3001, an image input portion 3002, a display portion 3003 and a keyboard 3004. The invention is applicable to signal control circuits of the image input portion 3002 and the display portion 3003.

FIG. 24B shows a video camera including a main body 3101, a display portion 3102, a voice input portion 3103, operation switches 3104, a battery 3105 and an image receiving portion 3106. The invention is applicable to a signal control circuit of the display portion 3102.

FIG. 24C shows a mobile computer including a main body 3201, a camera portion 3202, an image receiving portion 3203, an operation switch 3204 and a display portion 3205. The invention is applicable to a signal control circuit of the display portion 3205.

FIG. 24D shows a goggle type display including a main body 3301a display portion 3302 and an arm portion 3303. The invention is applicable to a signal control circuit of the display portion 3302.

FIG. 24E shows a player using a record medium recorded with programs (hereinafter, referred to as record medium) including a main body 3401, a display portion 3402, a speaker portion 3403, a record medium 3404 and an operation switch 3405. The player uses DVD (digital Versatile Disc) or CD as the record medium and can enjoy music, enjoy movie and carry out game or internet. The invention is applicable to a signal control circuit of the display portion 3402.

FIG. 24F shows a digital camera including a main body 3501, a display portion 3502, an eye contact portion 3503, operation switches 3504 and an image receiving portion (not illustrated). The invention is applicable to a signal control circuit of the display portion 3502.

Figure 25A:
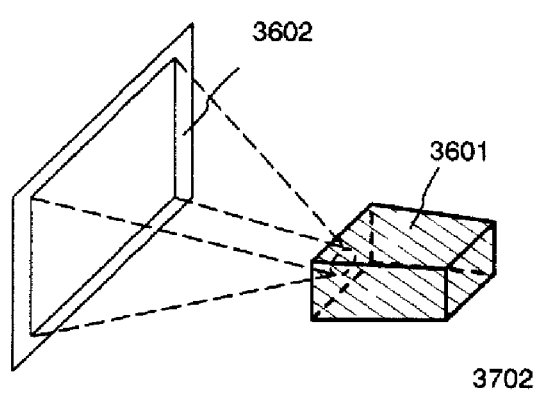
FIGS. 25A, 25B, 25C and 25D are views showing examples of semiconductor apparatus.

FIG. 25A shows a front type projector including a projection apparatus 3601 and a screen 3602. The invention is applicable to a signal control circuit of a liquid crystal display apparatus 3808 constituting a portion of the projection apparatus 3601.

Figure 25B:
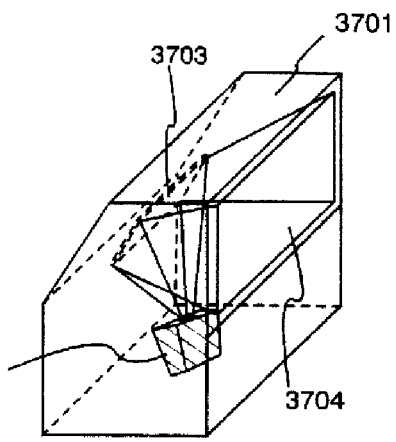

FIG. 25B shows a rear type projector including a main body 3701, a projection apparatus 3702, a mirror 3703 and a screen 3704. The invention is applicable to a signal control circuit of the liquid crystal display apparatus 3808 constituting a portion of the projection apparatus 3702.

Figure 25C:
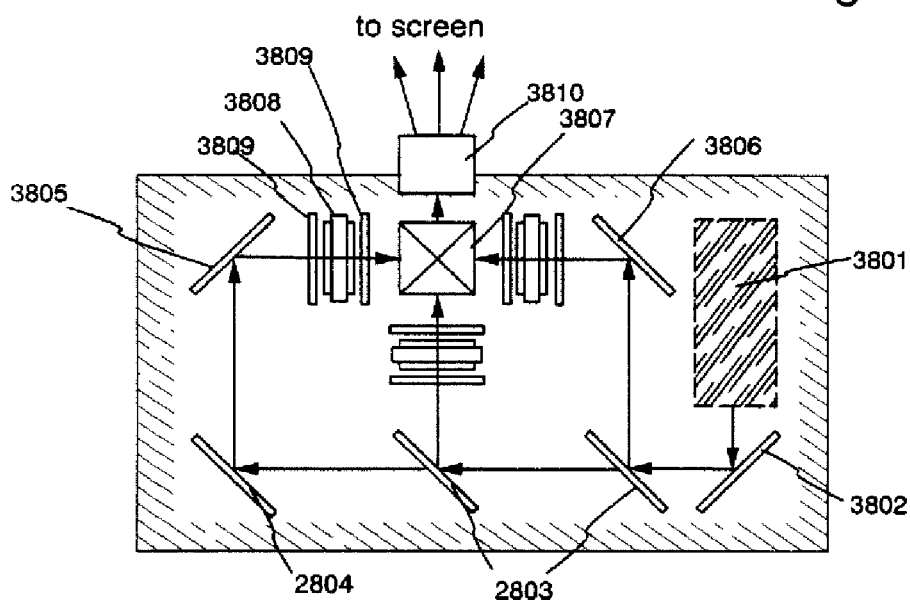

Further, FIG. 25C is a view showing an example of a structure of the projection apparatus 3601 and 3702 in FIG. 25A and FIG. 25B. The projection apparatus 3601 or 3702 is constituted by a light source optical system 3801, mirrors 3802, and 3804 through 3806, a dichroic mirror 3803, a prism 3807, a liquid crystal display apparatus 3808, a phase difference plate 3809 and a projection optical system 3810. The projection optical system 3810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 25C.

Figure 25D:
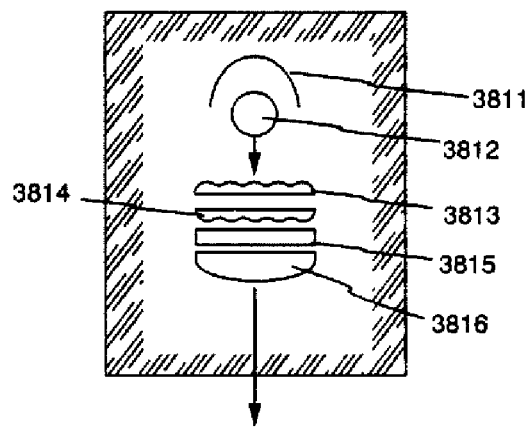

Further, FIG. 25D is a view showing an example of a structure of the light source optical system 3801 in FIG. 25C. According to the embodiment, the light source optical system 3801 is constituted by a reflector 3811, a light source 3812, lens arrays 3813 and 3814, a polarization conversion element 3815 and a focusing lens 3816. Further, the light source optical system shown in FIG. 25D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 25A, 25B and 25C, there is shown a case of using a transmission type electro-optic apparatus and an example of applying a reflection type electro-optic apparatus is not illustrated.

Figure 26A:
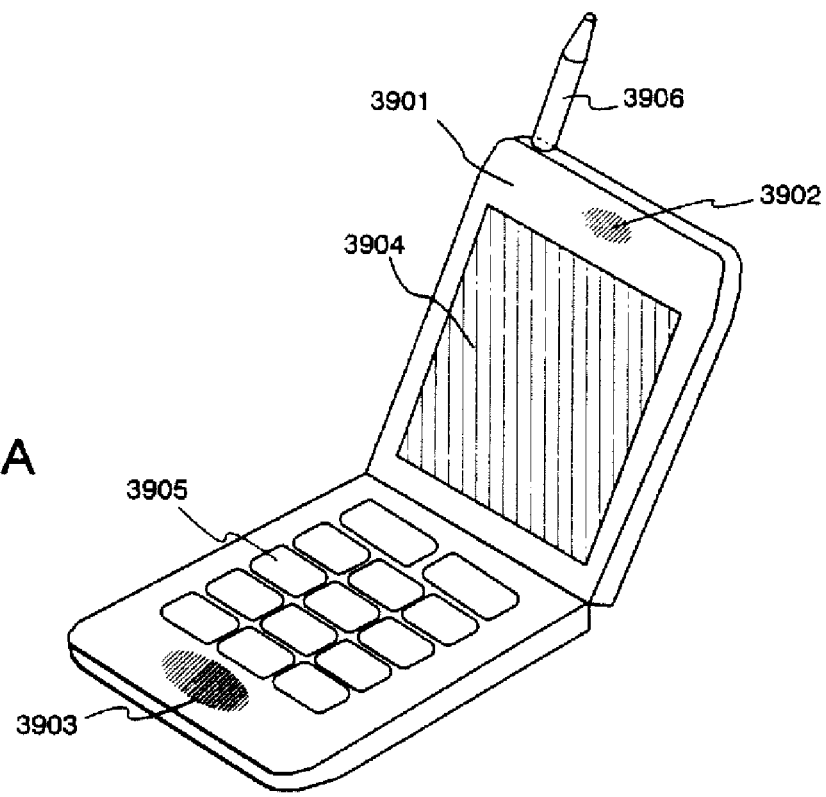
FIGS. 26A, 26B and 26C are views showing examples of semiconductor apparatus.

FIG. 26A shows a portable telephone including a main body 3901, a voice output portion 3902, a voice input portion 3903, a display portion 3904, an operation switch 3905 and an antenna 3906. The invention is applicable to signal control circuits of the voice output portion 3902, the voice input portion 3903 and the display portion 3904.

Figure 26B:
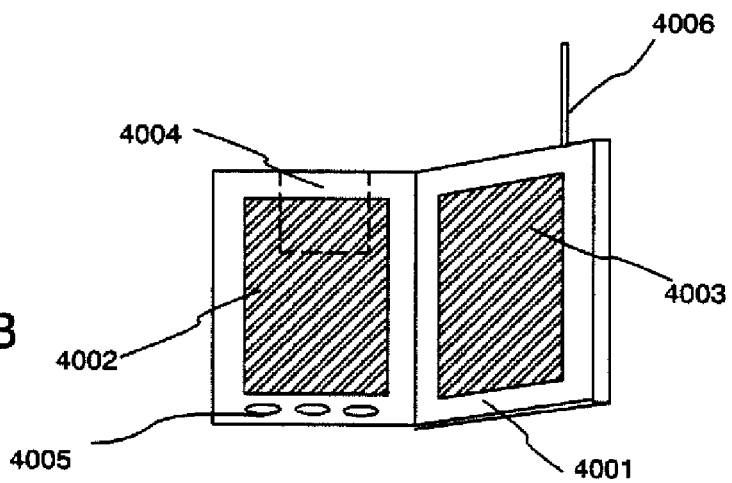

FIG. 26B shows a portable book (electronic book) including a main body 4001, display portions 4002 and 4003, a record medium 4004, an operation switch 4005 and an antenna 4006. The invention is applicable to signal circuits of the display portions 4002 and 4003.

Figure 26C:
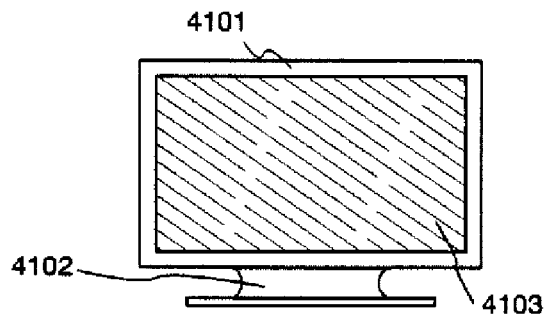
Figure 27A:
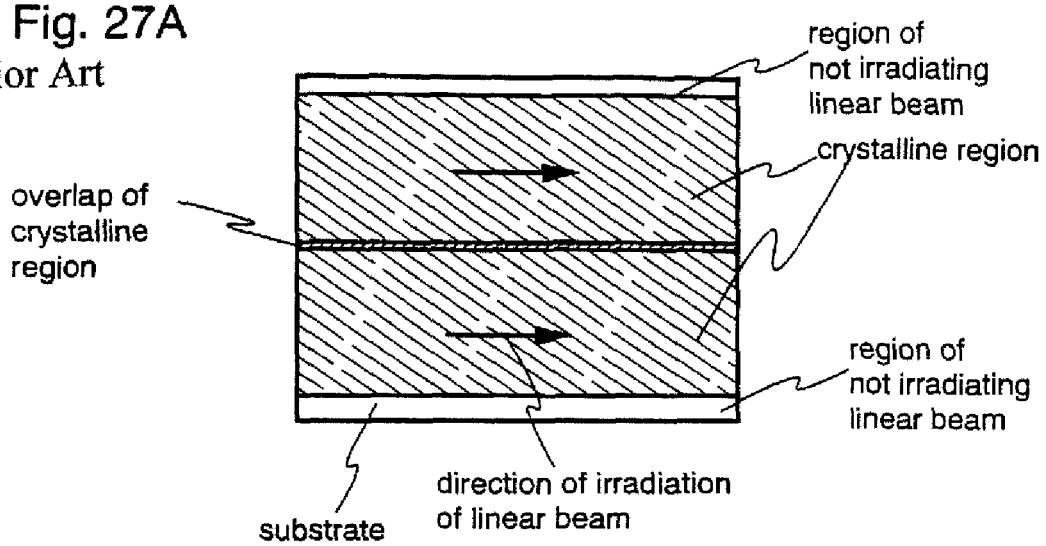
FIGS. 27A, 27B and 27C are views showing an example of a method of irradiating linear beam to a large area substrate.
Figure 27B:
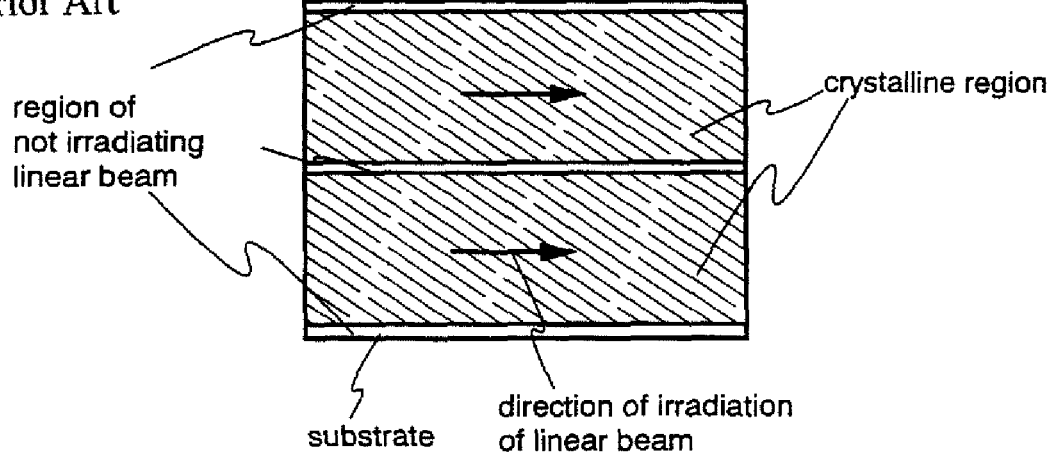
Figure 27C:
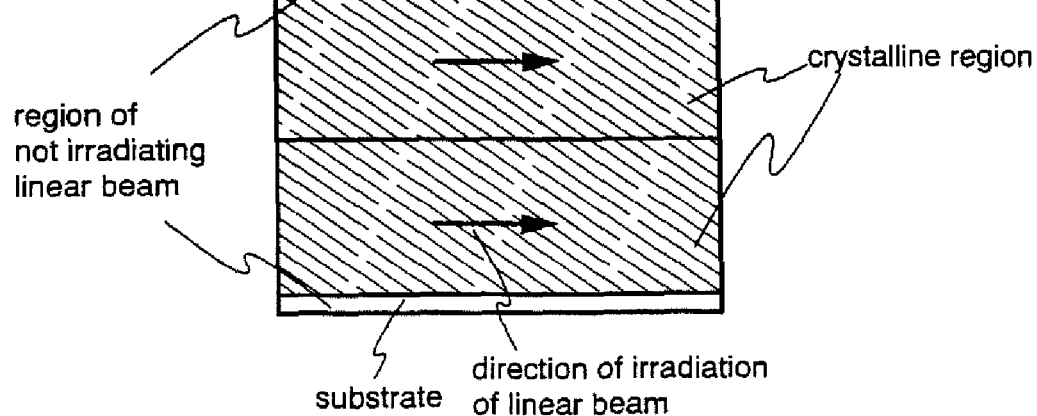

FIG. 26C shows a display including a main body 4101, a support base 4102 and a display portion 4103. The invention is applicable to the display portion 4103. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. Further, the electronic apparatus of the embodiment can be realized by using any constitution comprising any combinations of embodiments 1 through 8.

By adopting the constitution of the invention, there can be provided a basic significance shown below.

(a) There can be provided a crystalline semiconductor film having excellent crystalline performance even when there is present a region in an amorphous semiconductor film which is irradiated with linear beam while moving the linear beam over a plurality of times. However, a shape of laser beam at an irradiated face or a vicinity thereof is not limited to be linear but may be rectangular.

(b) In carrying out laser annealing at a large area substrate, it is not necessary to extend a length of linear beam in a longitudinal direction in conformity with the size of the large area substrate, which is particularly effective.

(c) When TFT is fabricated by using the crystalline semiconductor film, electric properties of the TFT are excellent and there is provided the TFT having characteristics with small dispersion.

What is claimed is:

1. A method of fabricating a semiconductor device comprising the steps of:
   forming an amorphous semiconductor film having an upper surface;
   forming a first crystalline region by irradiating a first region of the upper surface of the amorphous semiconductor film with a YAG laser by relatively moving the YAG laser in a first direction with respect to the first region of the amorphous semiconductor film; and
   after forming the first crystalline region, forming a second crystalline region by irradiating a second region of the upper surface of the amorphous semiconductor film including a portion of the first crystalline region with the YAG laser by relatively moving the YAG laser in a direction parallel to the first direction with respect to the second region of the amorphous semiconductor film,
   wherein a wavelength of the YAG laser falls in a range of 370 nm through 650 nm, and
   wherein the first region of the upper surface of the semiconductor film overlaps with a portion of the second region of the upper surface.

2. The method according to claim 1, wherein a shape of the YAG laser at an irradiated face or a vicinity thereof is a linear or rectangular shape.

3. The method according to claim 1, wherein the first direction is a direction orthogonal to the longitudinal direction of the YAG laser.

4. The method according to claim 1, wherein a crystalline performance of the first crystalline region, a crystalline performance of the second crystalline region and a crystalline performance of a region overlapped with the first crystalline region and the second crystalline region are the same.

5. The method according to claim 1, wherein the semiconductor device is a liquid crystal display apparatus or an EL display apparatus.

6. The method according to claim 1, wherein the semiconductor device is employed on a device selected from the group consisting of: a portable telephone, a video camera, a digital camera, a projector, a goggle type display, a personal computer, a DVD player, an electronic book and a portable information terminal.

7. A method of fabricating a semiconductor device comprising the steps of:
a first step of forming an amorphous semiconductor film having an upper surface;
a second step of forming a first crystalline semiconductor film by partially crystallizing the upper surface of the amorphous semiconductor film by a heating treatment; and
a third step of forming a second crystalline semiconductor film by irradiating the first crystalline semiconductor film with a YAG laser,
wherein the third step comprises the steps of:
forming a first crystalline region by irradiating a first region of the upper surface of the first crystalline semiconductor film with a YAG laser by relatively moving the YAG laser in a first direction with respect to the first region of the first crystalline semiconductor film; and
after forming the first crystalline region, forming a second crystalline region by irradiating a second region of the upper surface of the first crystalline semiconductor film including a portion of the first crystalline region with the YAG laser by relatively moving the YAG laser in a direction parallel to the first direction with respect to the second region of the first crystalline semiconductor film,
wherein a wavelength of the YAG laser falls in a range of 370 nm through 650 nm, and
wherein the first region of the upper surface of the semiconductor film overlaps with a portion of the second region of the upper surface.

8. The method according to claim 7, wherein a shape of the YAG laser at an irradiated face or a vicinity thereof is a linear or rectangular shape.

9. The method according to claim 7, wherein the first direction is a direction orthogonal to the longitudinal direction of the YAG laser.

10. The method according to claim 7, wherein a crystalline performance of the first crystalline region, a crystalline performance of the second crystalline region and a crystalline performance of a region overlapped with the first crystalline region and the second crystalline region are the same.

11. The method according to claim 7, wherein the semiconductor device is a liquid crystal display apparatus or an EL display apparatus.

12. The method according to claim 7, wherein the semiconductor device is employed on a device selected from the group consisting of: a portable telephone, a video camera, a digital camera, a projector, a goggle type display, a personal computer, a DVD player, an electronic book and a portable information terminal.

13. A method of fabricating a semiconductor device comprising the steps of:
forming an amorphous semiconductor film having an upper surface;
forming a first crystalline region by irradiating a first region of the upper surface of the amorphous semiconductor film with a first YAG laser having a first wavelength by relatively moving the first YAG laser in a first direction with respect to the first region of the amorphous semiconductor film; and
after forming the first crystalline region, forming a second crystalline region by irradiating a second region of the upper surface of the amorphous semiconductor film including a portion of the first crystalline region with a second YAG laser having a second wavelength by relatively moving the second YAG laser in a direction parallel to the first direction with respect to the second region of the amorphous semiconductor film,
wherein the first wavelength of the first YAG laser falls in a range of 370 nm through 650 nm,
wherein the second wavelength of the second YAG laser falls in a range of 370 nm through 650 nm, and
wherein the first region of the upper surface of the semiconductor film overlaps with a portion of the second region of the upper surface.

14. The method according to claim 13, wherein a shape of the first YAG laser at an irradiated face or a vicinity thereof is a linear or rectangular shape, and
wherein a shape of the second YAG laser at an irradiated face or a vicinity thereof is a linear or rectangular shape.

15. The method according to claim 13, wherein the first direction is a direction orthogonal to the longitudinal direction of the first YAG laser.

16. The method according to claim 13, wherein a crystalline performance of the first crystalline region, a crystalline performance of the second crystalline region and a crystalline performance of a region overlapped with the first crystalline region and the second crystalline region are the same.

17. The method according to claim 13, wherein the semiconductor device is a liquid crystal display apparatus or an EL display apparatus.

18. The method according to claim 13, wherein the semiconductor device is employed on a device selected from the group consisting of: a portable telephone, a video camera, a digital camera, a projector, a goggle type display, a personal computer, a DVD player, an electronic book and a portable information terminal.

* * * * *

UNITED STATES PATENT AND TRADEMARK OFFICE
CERTIFICATE OF CORRECTION

PATENT NO. : 7,951,654 B2
APPLICATION NO. : 12/704617
DATED : May 31, 2011
INVENTOR(S) : Koichiro Tanaka It is certified that error appears in the above-identified patent and that said Letters Patent is hereby corrected as shown below:

Title Page, item (57), Abstract, line 10 under "ABSTRACT", replace "370 rim" with -- 370nm --
    Title Page, item (57), Abstract, line 11 under "ABSTRACT", replace "1n general" with
    -- In general --
    Column 4, line 50, replace "measure" with -- measured --
    Column 7, line 9, replace "abeam" with -- a beam --
    Column 13, line 6, replace "orgallium" with -- or gallium --
    Column 14, line 12, replace "a" with -- α --
    Column 14, line 18, replace "a" with -- α --
    Column 16, line 3, replace "tire" with -- the --
    Column 24, line 13, replace "disinclination" with -- disclination --
    Column 28, line 29, replace "awhile" with -- a white --
    Column 31, line 26, replace "FIG. 98" with -- FIG. 9B --
    Column 32, line 62, replace "FIGS. 26A, 2613" with -- FIGS. 26A, 26B --
    Column 33, line 12, replace "3301a" with -- 3301, a --
    Column 33, line 43, replace "a" with -- α --
    Column 33, line 52, replace "a" with -- α --
    Column 33, line 64, replace "a" with -- α --

Signed and Sealed this
Thirteenth Day of March, 2012

David J. Kappos
*Director of the United States Patent and Trademark Office*